(12) United States Patent
Zheng et al.

(10) Patent No.: US 12,029,021 B2
(45) Date of Patent: Jul. 2, 2024

(54) STATIC RANDOM-ACCESS MEMORY (SRAM) BIT CELL WITH CHANNEL DEPOPULATION

(71) Applicant: Intel Corporation, Santa Clara, CA (US)

(72) Inventors: Peng Zheng, Portland, OR (US); Varun Mishra, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/701,419

(22) Filed: Mar. 22, 2022

(65) Prior Publication Data

US 2022/0216221 A1     Jul. 7, 2022

Related U.S. Application Data

(62) Division of application No. 16/827,570, filed on Mar. 23, 2020, now Pat. No. 11,315,934.

(51) Int. Cl.
| | |
|---|---|
| *H10B 10/00* | (2023.01) |
| *H01L 21/265* | (2006.01) |
| *H01L 21/306* | (2006.01) |
| *H01L 21/8238* | (2006.01) |
| *H01L 27/092* | (2006.01) |
| *H01L 29/06* | (2006.01) |
| *H01L 29/08* | (2006.01) |
| *H01L 29/10* | (2006.01) |
| *H01L 29/167* | (2006.01) |

(Continued)

(52) U.S. Cl.
CPC ....... *H10B 10/12* (2023.02); *H01L 21/26513* (2013.01); *H01L 21/30604* (2013.01); *H01L 21/823821* (2013.01); *H01L 21/823828* (2013.01); *H01L 27/0922* (2013.01); *H01L 27/0924* (2013.01); *H01L 29/0673* (2013.01); *H01L 29/0847* (2013.01); *H01L 29/1037* (2013.01); *H01L 29/167* (2013.01); *H01L 29/36* (2013.01); *H01L 29/66545* (2013.01)

(58) Field of Classification Search
CPC ............ H01L 27/0922; H01L 27/0924; H01L 29/0673; H01L 29/0847; H01L 29/1037; H01L 29/167; H01L 29/36; H10B 10/12; H10B 10/125
See application file for complete search history.

(56) References Cited

U.S. PATENT DOCUMENTS 10,204,902 B2 * 2/2019 Lee ................... H01L 29/78654
10,243,054 B1 * 3/2019 Cheng .................. H01L 27/088
(Continued)

*Primary Examiner* — Dao H Nguyen
(74) *Attorney, Agent, or Firm* — Schwabe, Williamson & Wyatt, P.C.

(57) ABSTRACT

Embodiments disclosed herein include transistor devices with depopulated channels. In an embodiment, the transistor device comprises a source region, a drain region, and a vertical stack of semiconductor channels between the source region and the drain region. In an embodiment, the vertical stack of semiconductor channels comprises first semiconductor channels, and a second semiconductor channel over the first semiconductor channels. In an embodiment, first concentrations of a dopant in the first semiconductor channels are less than a second concentration of the dopant in the second semiconductor channel.

14 Claims, 19 Drawing Sheets

(51) Int. Cl.
*H01L 29/36* (2006.01)
*H01L 29/66* (2006.01)

(56) References Cited

U.S. PATENT DOCUMENTS

| | | | |
|---|---|---|---|
| 2017/0221884 A1* | 8/2017 | Machkaoutsan | H01L 21/8221 |
| 2020/0287055 A1 | 9/2020 | Lee | |
| 2021/0082707 A1 | 3/2021 | Fan | |
| 2021/0098473 A1* | 4/2021 | Lin | H01L 21/3065 |
| 2021/0134677 A1* | 5/2021 | Pan | H01L 29/66545 |
| 2021/0167064 A1* | 6/2021 | Noh | H01L 21/02532 |
| 2021/0408009 A1* | 12/2021 | Zheng | H01L 29/775 |

* cited by examiner

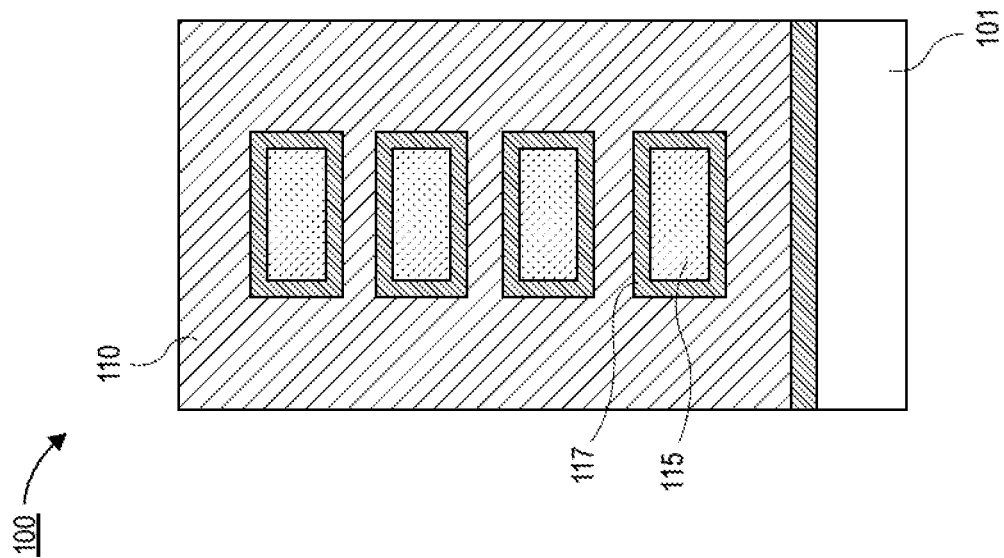
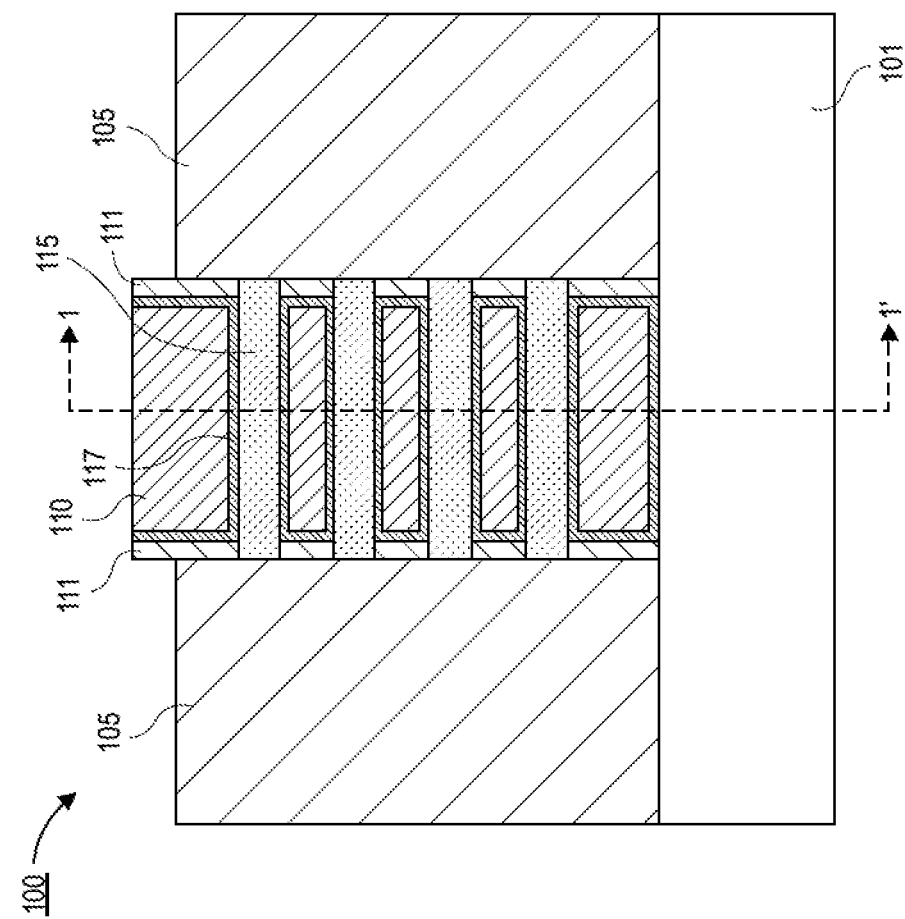

STATIC RANDOM-ACCESS MEMORY (SRAM) BIT CELL WITH CHANNEL DEPOPULATION

CROSS-REFERENCE TO RELATED APPLICATIONS

This application is a division of U.S. patent application Ser. No. 16/827,570, filed on Mar. 23, 2020, the entire contents of which is hereby incorporated by reference herein.

TECHNICAL FIELD

Embodiments of the present disclosure relate to semiconductor devices, and more particularly to nanoribbon and nanowire transistors with depopulated channels for use in integrated circuitry, such as static random-access memory (SRAM).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 1A is a cross-sectional illustration of a transistor with a plurality of stacked semiconductor channels, in accordance with an embodiment.

FIG. 1B is a cross-sectional illustration of the transistor in FIG. 1A, along line 1-1', in accordance with an embodiment.

EMBODIMENTS OF THE PRESENT DISCLOSURE

Figure 1C:
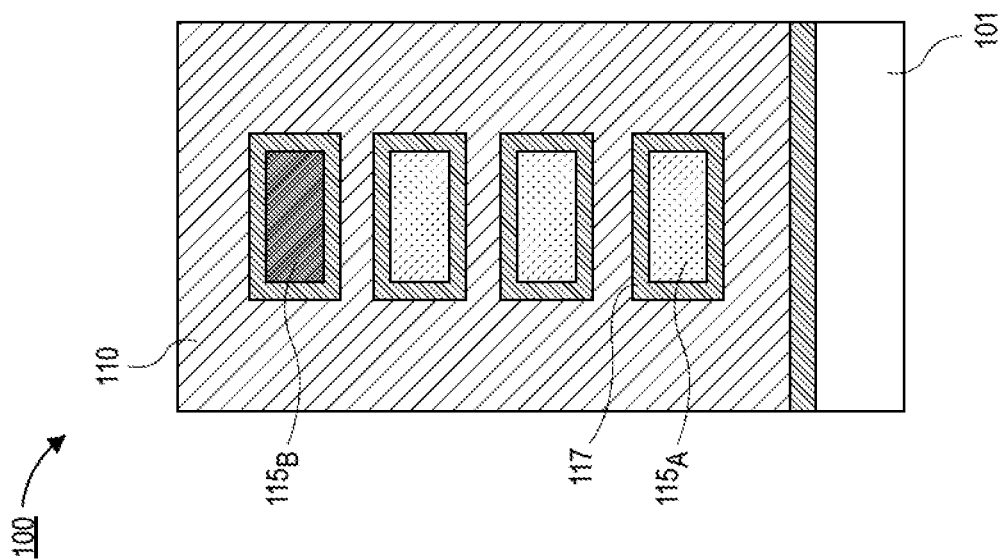
FIG. 1C is a cross-sectional illustration of a transistor with a depopulated channel, in accordance with an embodiment.

Described herein are nanoribbon and nanowire transistors with depopulated channels for use in integrated circuitry, such as static random-access memory (SRAM), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

One or more embodiments described herein are directed depopulation of one or more channels in a nanowire or nanoribbon transistor. One or more embodiments described herein provide bottom-up channel depopulation, and one or more embodiments described herein provide top-down channel depopulation. One or more embodiments described herein utilize depopulated channels in integrated circuit devices, such as SRAM cells.

To provide context, transistors with different drive currents may be needed for different circuit types. Embodiments disclosed herein are directed to achieving different drive currents by depopulating the number of nanowire transistor channels in device structures. One or more embodiments provide an approach for deleting discrete numbers of wires from a transistor structure. One or more embodiments provide an approach for rendering a discrete number of wires from a transistor structure as non-conducting. Approaches may be suitable for both ribbons and wires (RAW). As such, references to a nanowire herein may be construed as including a nanowire or a nanoribbon.

In accordance with an embodiment of the present disclosure, described herein is a process flow for achieving top-down nanowire transistor channel depopulation. Embodiments may include channel depopulation of nanowire transistors to provide for modulation of drive currents in different devices, which may be needed for different circuits.

In accordance with an embodiment of the present disclosure, nanowire processing of an alternating Si/SiGe stack includes patterning the stack into fins. Generic dummy gates (which may or may not be poly dummy gates) are patterned and etched. Source/drain regions may be formed on opposite ends of the dummy gates. The dummy gate is then removed to expose the remaining portions of the alternating Si/SiGe stack (i.e., the channel region). A pre-amorphization implantation may be implemented. Following the pre-amorphization, a depopulation dopant is implanted into the top Si layer. The pre-amorphization implantation disrupts the crystal structure of top Si layer and minimizes tunneling of subsequent dopants to lower Si layers. In this way, the top Si layer is rendered non-conducting without negatively impacting the underlying Si layers.

In accordance with an embodiment of the present disclosure, described herein is a process flow for achieving bottom-up nanowire transistor channel depopulation. Embodiments may include channel depopulation of nanowire transistors to provide for modulation of drive currents in different devices, which may be needed for different circuits.

In accordance with an embodiment of the present disclosure, nanowire processing of an alternating Si/SiGe stack includes patterning the stack into fins. Generic dummy gates (which may or may not be poly dummy gates) are patterned and etched. A hardmask or other blocking layer is deposited and recessed to below a top of a last SiGe layer on the bottom. A hard mask selective to the blocking layer is conformally deposited and slimmed to protect the top Si/SiGe layers. The blocking layer is removed and a dummy gate oxide is broken-through, exposing the bottom SiGe layer. The SiGe bottom layer is then etched away from the bottom-up and stops on the bottom Si nanowire and substrate below. The bottom Si nanowire is then etched away and stops on the next SiGe layer (and some substrate may also be etched). The sequence can then be repeated, e.g., etch SiGe, then etch Si. In this way, Si nanowires are etched away sequentially from the bottom-up.

Although the preceding processes describe using Si and SiGe layers, other pairs of semiconductor materials which can be alloyed and grown epitaxially could be implemented to achieve various embodiments herein, for example, InAs and InGaAs, or SiGe and Ge.

In accordance with an embodiment of the present disclosure, nanowire transistors with channel depopulation may be utilized in SRAM cells. The ability to fine tune the drive strength of individual transistors allows for a better balance between read stability and write-ability without the need for assist circuitry. For example, the pull-up (PU) transistors may be implemented with depopulated channels, whereas the pull-down (PD) and pass-gate (PG) transistors may be implemented without depopulated channels. As a result, the drive strength of the PU transistors is effectively reduced compared to that of the PG and PD transistors. By eliminating the need for assist circuits, chip area is saved and power consumption is reduced. While the particular example of a six-transistor (6-T) SRAM is provided, it is to be appreciated that various circuit architectures may also benefit from the depopulation of one or more channels of a transistor in the circuit in order to provide modulated drive currents across the circuit.

Referring now to FIG. 1A, a cross-sectional illustration of a nanowire transistor 100 is shown, in accordance with an embodiment. The nanowire transistor 100 comprises a substrate 101. The substrate 101 may be an insulating material or may comprise an insulating material and a semiconductor material. For example, the semiconductor material may include remnant portions of a semiconductor fin, from which the transistor 100 is fabricated. In an embodiment, an underlying semiconductor substrate (not shown) that is below the substrate 101 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the transistor 100 may comprise source/drain regions 105 that are on opposite ends of a stack of nanowire channels 115. The source/drain regions 105 are formed by conventional processes. For example, recesses are formed adjacent to the gate electrode 110. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum.

In an embodiment, spacers 111 may separate the gate electrode 110 from the source/drain regions 105. The nanowire channels 115 may pass through the spacers 111 to connect to the source/drain regions 105 on either side of the nanowire channels 115. In an embodiment, a gate dielectric 117 surrounds the perimeter of the nanowire channels 115 to provide gate-all-around (GAA) control of the transistor 100. The gate dielectric 117 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 117 to improve its quality when a high-k material is used.

In an embodiment, the gate electrode 110 surrounds the gate dielectric layer 117 within the spacers 111. In the illustrated embodiment, the gate electrode 110 is shown as a single monolithic layer. However, it is to be appreciated that the gate electrode 110 may comprise a workfunction metal over the gate dielectric layer 117 and a gate fill metal. When the workfunction metal will serve as an N-type workfunction metal, the workfunction metal of the gate electrode 110 preferably has a workfunction that is between about 3.9 eV and about 4.2 eV. N-type materials that may be used to form the metal of the gate electrode 110 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, workfunction metal of the gate electrode 110 preferable has a workfunction that is between about 4.9 eV and about 5.2 eV. P-type materials that may be used to form the metal of the gate electrode 110 include, but are not limited to, ruthenium, palladium, platinum, cobalt, nickel, and conductive metal oxides, e.g., ruthenium oxide.

In the illustrated embodiment, the transistor 100 is shown as having four nanowire channels 115. However, it is to be appreciated that transistors 100 may include any number of nanowire channels 115 in accordance with various embodiments. Furthermore, FIG. 1A illustrates that all of the nanowire channels 115 are functional channels. That is, each of the nanowire channels 115 is capable of conducting electricity, in order to provide a given drive current for the transistor 100.

Referring now to FIG. 1B, a cross-sectional illustration of the transistor 100 in FIG. 1A along line 1-1' is shown, in accordance with an embodiment. As shown, all four nanowire channels 115 are illustrated with the same shading to indicate that they are all functioning channels. As will be described below, one or more of the nanowire channels 115 may be depopulated in order to modulate the drive current of the transistor 100.

Referring now to FIG. 1C, a cross-sectional illustration of a transistor 100 with a modulated drive current is shown, in accordance with an embodiment. As shown, the transistor 100 comprises first nanowire channels 115$_A$ and a second nanowire channel 115$_B$. In an embodiment, the second nanowire channel 115$_B$ is a depopulated channel. That is, the second nanowire channel 115$_B$ may not be capable of conducting current under normal operating conditions of the transistor 100. As such, the drive current of the transistor 100 is reduced compared to the drive current of the transistor 100 shown in FIG. 1A and FIG. 1B. The transistor 100 in FIG. 1C is an example of a top-down channel depopulation. That is, the depopulated second nanowire channel 115$_B$ is positioned above the first nanowire channels 115$_A$, relative to the substrate 101.

In an embodiment, the depopulated second nanowire channel 115$_B$ is rendered inactive due to a high concentration of a depopulation dopant. The conductivity type (e.g., N-type or P-type) of the depopulation dopant needed to prevent current from passing across the second nanowire channel 115$_B$ is the opposite conductivity type of the transistor 100. For example, when the transistor is an N-type transistor, the depopulation dopant in the second nanowire channel 115$_B$ is a P-type dopant (e.g., in the case of a silicon nanowire channel 115$_B$, the depopulation dopant may be boron, gallium, etc.), and when the transistor is a P-type transistor, the depopulation dopant in the second nanowire channel 115$_B$ is an N-type dopant (e.g., in the case of a silicon nanowire channel 115$_B$, the depopulation dopant may be phosphorous, arsenic, etc.).

In an embodiment, a concentration of the depopulation dopant that blocks conductivity across the second nanowire channel 115$_B$ may be approximately $1e19$ cm$^{-3}$ or greater, or approximately $1e20$ cm$^{-3}$ or greater. In an embodiment, the concentration of the depopulation dopant in the second nanowire channel 115$_B$ may be approximately two orders of magnitude greater than the concentration of the depopulation dopant in the first nanowire channels 115$_A$, or the concentration of the depopulation dopant in the second nanowire channel 115$_B$ may be approximately three orders of magnitude greater than the concentration of the depopulation dopant in the first nanowire channels 115$_A$. The concentrations of the depopulation dopant in the first nanowire channels 115$_A$ is low enough that the conductivities of the first nanowire channels 115$_A$ are not significantly reduced.

As will be described in greater detail below, the ability to selectively dope the second nanowire channel 115$_B$ over the first nanowire channels 115$_A$ is provided, at least in part, by a pre-amorphization implant. A pre-amorphization implant includes implanting a species into the second nanowire channel 115$_B$ that disrupts the crystal structure of the second nanowire channel 115$_B$. That is, in some embodiments, a degree of crystallinity of the second nanowire channel 115$_B$ may be lower than a degree of crystallinity of the first nanowire channels 115$_A$. Disrupting the crystal structure of the second nanowire channel 115$_B$ limits subsequently implanted depopulation dopants from tunneling into the underlying first nanowire channels 115$_A$. The pre-amorphization species is an element that does not significantly alter the conductivity of the second nanowire channel 115$_B$. That is, the pre-amorphization species is substantially non-electrically active. For example, in the case of a silicon nanowire channel, the pre-amorphization species may comprise germanium. Accordingly, embodiments disclosed herein may also exhibit a concentration of the pre-amorphization species in the second nanowire channel $115_B$.

As shown, the second nanowire channel $115_B$ may have a structure that is similar to the structure of the first nanowire channels $115_A$ (with the exception of the concentration of the depopulation dopant, the degree of crystallinity, and the concentration of the pre-amorphization species). For example, the second nanowire channels $115_B$ may be surrounded by the gate dielectric 117. Additionally, the dimensions, (e.g., channel length, thickness and/or width) of the second nanowire channel $115_B$ may be substantially similar to the dimensions of the first nanowire channels $115_A$. Furthermore, it is to be appreciated that the base material for the second nanowire channels $115_B$ and the first nanowire channels $115_A$ may be substantially the same. For example, both may comprise silicon as the base material.

Figure 1D:
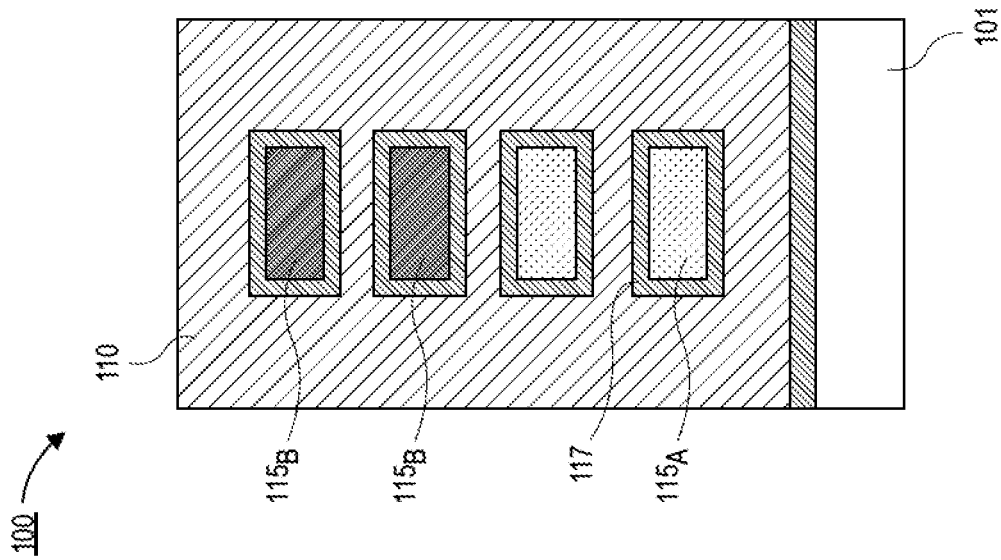
FIG. 1D is a cross-sectional illustration of a transistor with two depopulated channels, in accordance with an embodiment.

Referring now to FIG. 1D, a cross-sectional illustration of a transistor 100 with a modulated drive current is shown, in accordance with an additional embodiment. The transistor 100 in FIG. 1D may be substantially similar to the transistor 100 in FIG. 1C, with the exception that an additional second nanowire channel $115_B$ is provided. The two second nanowire channels $115_B$ are fabricated in a top-down configuration. That is, the second nanowire channels $115_B$ are positioned over the first nanowire channels $115_A$, relative to the substrate 101. While transistors 100 are shown with a single depopulated second nanowire channel $115_B$ and a pair of depopulated second nanowire channels $115_B$, it is to be appreciated that any number of nanowire channels 115 may be depopulated to provide a desired drive current for the transistor 100.

Referring now to FIGS. 2A-2H, a series of cross-sectional illustrations depict a process for forming a transistor 200 with one or more depopulated nanowire channels using a top-down depopulation approach is shown, in accordance with an embodiment.

Figure 2B:
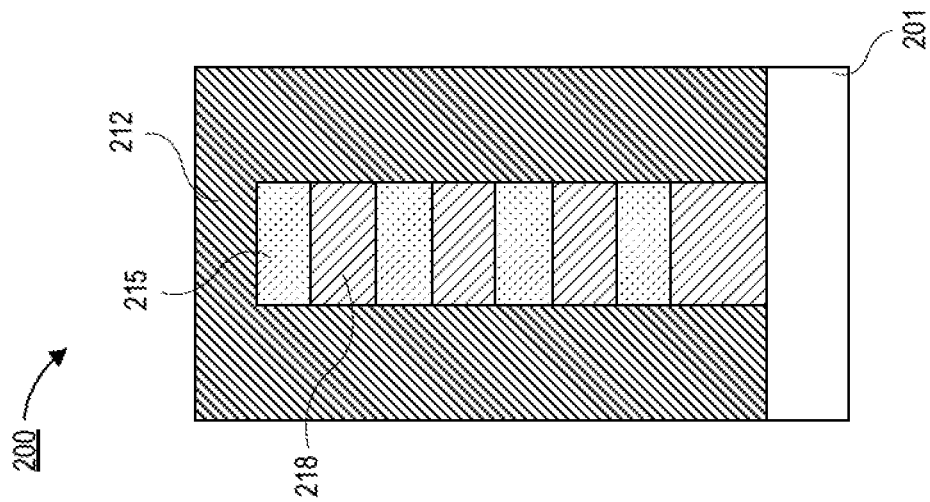
FIG. 2B is a cross-sectional illustration of the transistor in FIG. 2A along line 2-2', in accordance with an embodiment.
Figure 2A:
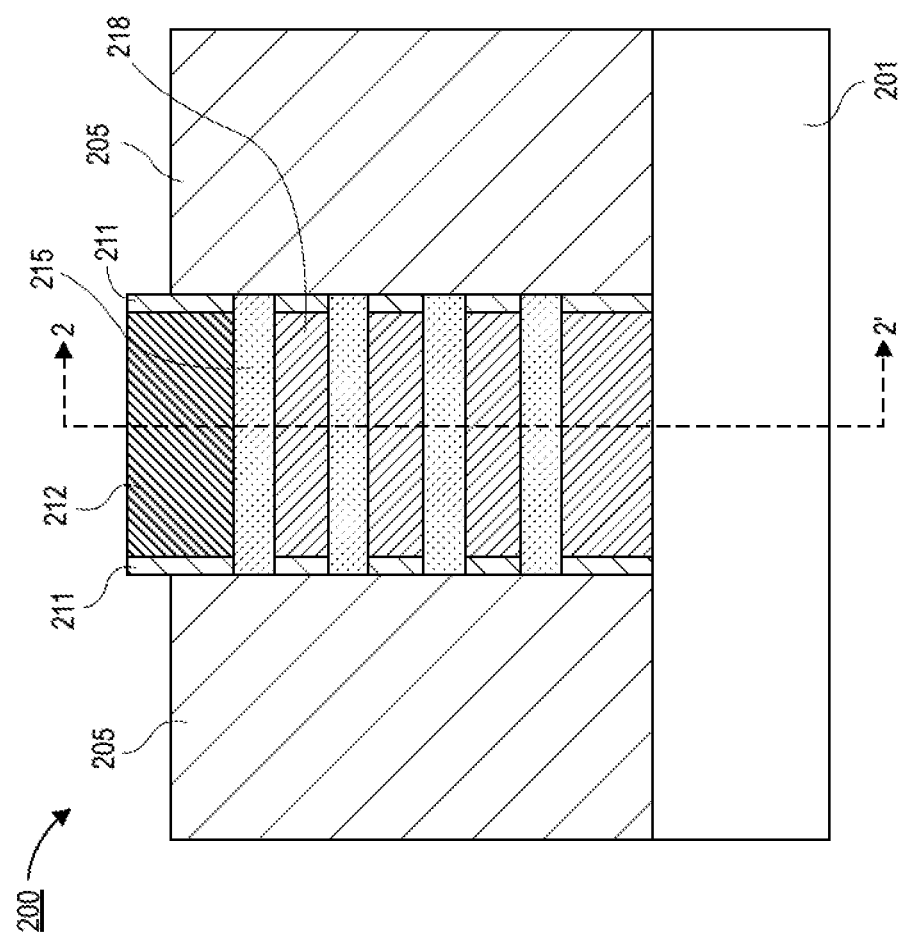
FIG. 2A is a cross-sectional illustration of transistor after source/drain regions are formed, in accordance with an embodiment.

Referring now to FIG. 2A, a cross-sectional illustration of a transistor 200 is shown, in accordance with an embodiment. In the illustrated embodiment, source/drain regions 205 have been formed on opposite ends of a gate structure over a substrate 201. The gate structure may comprise a dummy gate electrode 212 and spacers 211. The gate structure may cover a stack of nanowire channels 215 and sacrificial layers 218. For example, the nanowire channels 215 may comprise silicon and the sacrificial layers 218 may comprise silicon germanium, though other suitable material choices with etch selectivity between the nanowire channels 215 and the sacrificial layers 218 may be used. In an embodiment, the nanowire channels 215 extend through the spacers 211 to contact the source/drain regions 205. In an embodiment, the dummy gate electrode 212 may comprise polysilicon.

Referring now to FIG. 2B, a cross-sectional illustration of the transistor 200 in FIG. 2A along line 2-2' is shown, in accordance with an embodiment. As shown, the dummy gate electrode 212 wraps around the sidewalls and top surface of the stack of nanowire channels 215 and sacrificial layers 218.

Figure 2D:
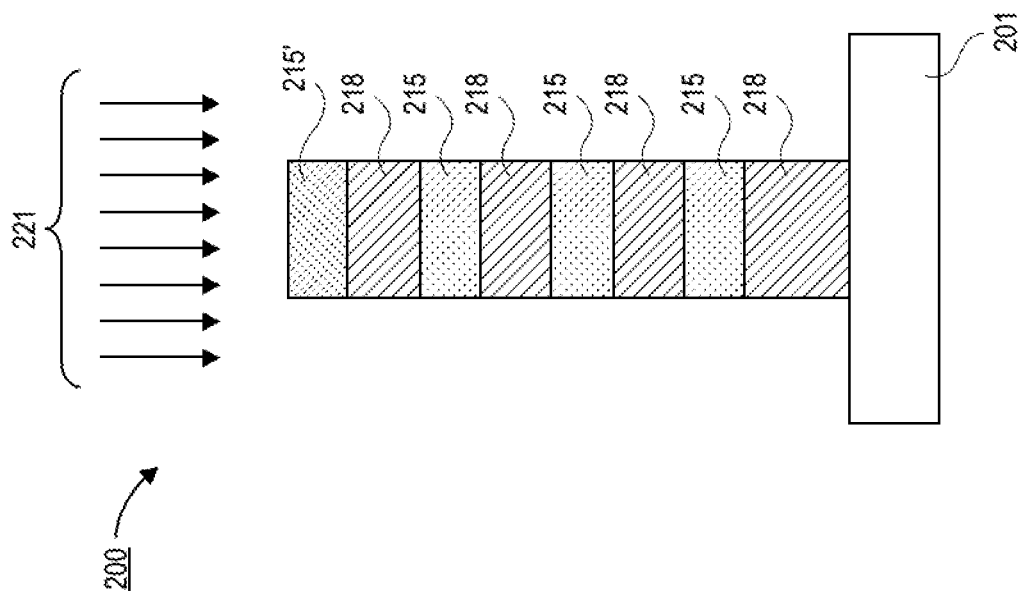
FIG. 2D is a cross-sectional illustration of the transistor after a pre-amorphization process is implemented on the top channel, in accordance with an embodiment.
Figure 2C:
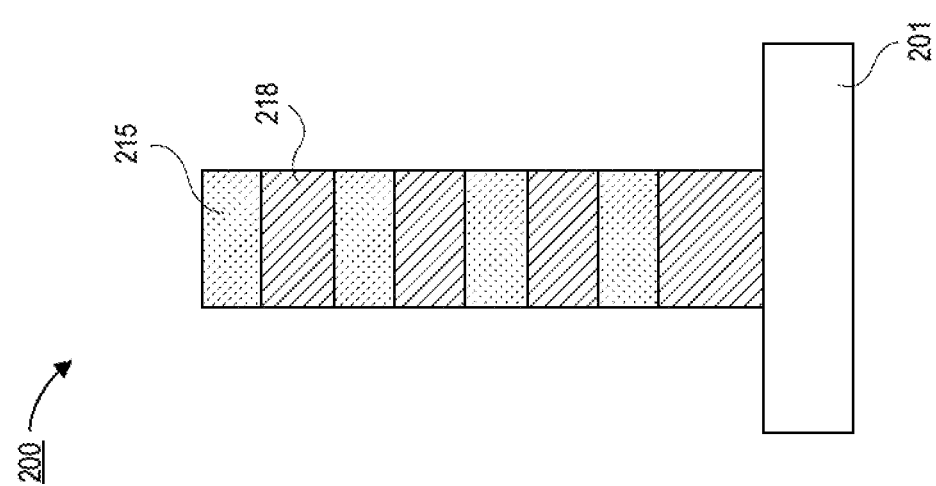
FIG. 2C is a cross-sectional illustration of the transistor after a sacrificial gate is removed, in accordance with an embodiment.

Referring now to FIG. 2C, a cross-sectional illustration of the transistor 200 after the dummy gate electrode 212 is removed is shown, in accordance with an embodiment. In an embodiment, the dummy gate electrode 212 may be removed with a suitable etching process.

Referring now to FIG. 2D, a cross-sectional illustration of the transistor 200 during a pre-amorphization implantation process is shown, in accordance with an embodiment. As shown, pre-amorphization species 221 are implanted into the stack. The implantation may be implemented with no tilt. As such, the pre-amorphization species 221 will only enter the stack through the topmost nanowire channel 215'. In an embodiment, the energy of the implantation process is chosen to isolate the majority of the pre-amorphization species 221 into the topmost nanowire channel 215'. For example, an implantation energy of the pre-amorphization species may be between approximately 1 keV and approximately 2 keV. In order to represent a change in crystallinity of the topmost nanowire channel 215', the shading of the topmost nanowire channel 215' is different than the shading of the underlying nanowire channels 215. In an embodiment, the pre-amorphization species 221 may comprise germanium or silicon.

In the illustrated embodiment, the pre-amorphization implant is isolated to the topmost nanowire channel 215'. However, it is to be appreciated that by increasing the energy of the pre-amorphization implant, additional nanowire channels 215 (from the top-down) may also be altered in order to allow for more than one nanowire channel 215 to be depopulated.

Figure 2F:
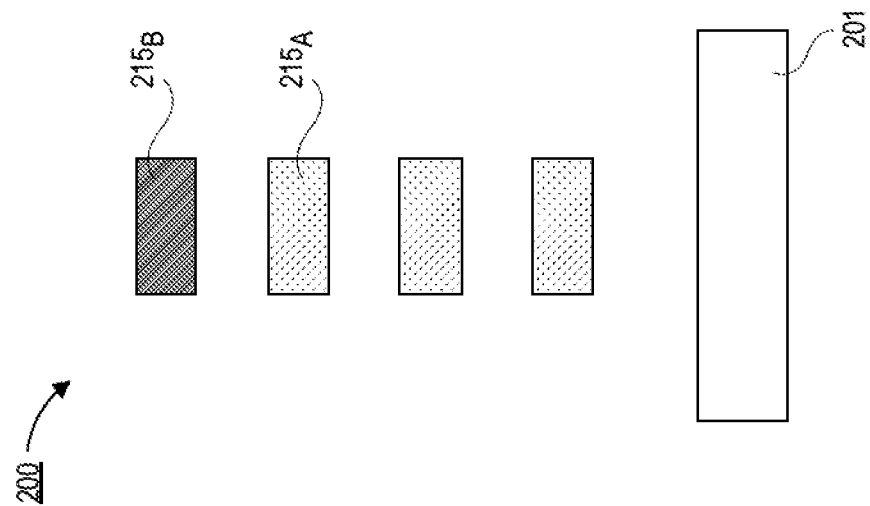
FIG. 2F is a cross-sectional illustration of the transistor after the sacrificial layers between the channels are removed, in accordance with an embodiment.
Figure 2E:
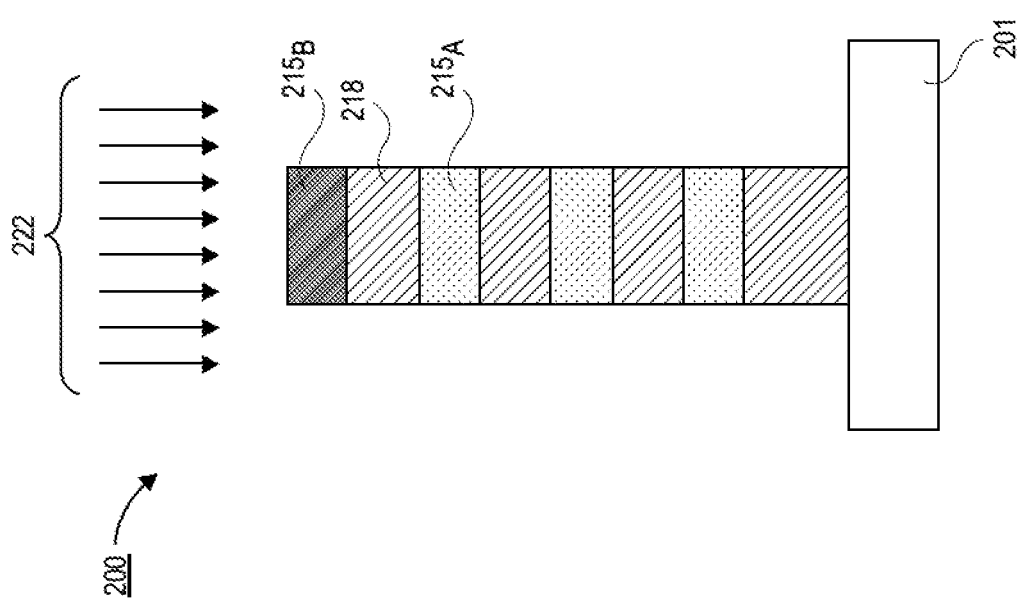
FIG. 2E is a cross-sectional illustration of the transistor after a dopant is selectively implanted into the top channel, in accordance with an embodiment.

Referring now to FIG. 2E, a cross-sectional illustration of the transistor 200 during a depopulation dopant implant is shown, in accordance with an embodiment. As shown, depopulation dopants 222 are implanted into the stack. The implantation may be implemented with no tilt. As such, the depopulation dopants 222 will only enter the stack through the topmost nanowire channel $215_B$. In an embodiment, the depopulation dopant implant is implemented after the pre-amorphization implant without an annealing process between the two implants. As such, the disrupted crystal structure of the nanowire channel 215' remains and limits the ability of the depopulation dopants 222 from tunneling down to lower nanowire channels 215. That is, first nanowire channels $215_A$ have concentrations of the depopulation dopant 222 that are low enough to not alter the conductivities of the first nanowire channels $215_A$, and the second nanowire channel $215_B$ (i.e., the topmost nanowire channel) has a concentration of the depopulation dopant 222 that is sufficient to prevent current from passing through the second nanowire channel $215_B$.

In an embodiment, a concentration of the depopulation dopant 222 of the second nanowire channel $215_B$ may be approximately 1e19 cm$^{-3}$ or greater, or approximately 1e20 cm$^{-3}$ or greater. In an embodiment, the concentration of the depopulation dopant 222 in the second nanowire channel $215_B$ may be approximately two orders of magnitude greater than the concentration of the depopulation dopant 222 in the first nanowire channels $215_A$, or the concentration of the depopulation dopant 222 in the second nanowire channel $215_B$ may be approximately three orders of magnitude greater than the concentration of the depopulation dopant 222 in the first nanowire channels $215_A$. In an embodiment, the depopulation dopant 222 may comprise an N-type dopant (e.g., in the case of a silicon nanowire channel 215, phosphorous, arsenic, etc.) or a P-type dopant (e.g., in the case of a silicon nanowire channel 215, boron, gallium, etc.).

In the illustrated embodiment, the depopulation dopants 222 are substantially isolated to the topmost second nanowire channel $215_B$. However, it is to be appreciated that by increasing the energy of the depopulation dopant implant (in conjunction with a more aggressive pre-amorphization implant), additional nanowire channels 215 (from the top-down) may also be altered in order to allow for more than one nanowire channel 215 to be depopulated. In an embodiment, the depopulation dopant implant may have an energy between approximately 1 keV and approximately 2 keV.

Referring now to FIG. 2F, a cross-sectional illustration of the transistor 200 after the sacrificial layers 218 are removed is shown, in accordance with an additional embodiment. In an embodiment, the sacrificial layers 218 may be removed with a suitable etching process that removes the sacrificial layers 218 selective the nanowire channels 215. In an embodiment, where the sacrificial layers 218 are silicon germanium and the nanowire channels 215 are silicon, the silicon germanium layer is etched selectively with a wet etch that selectively removes the silicon germanium while not etching the silicon layers. Etch chemistries such as carboxylic acid/nitric acid/HF chemistry, and citric acid/nitric acid/HF, for example, may be utilized to selectively etch the silicon germanium.

Figure 2H:
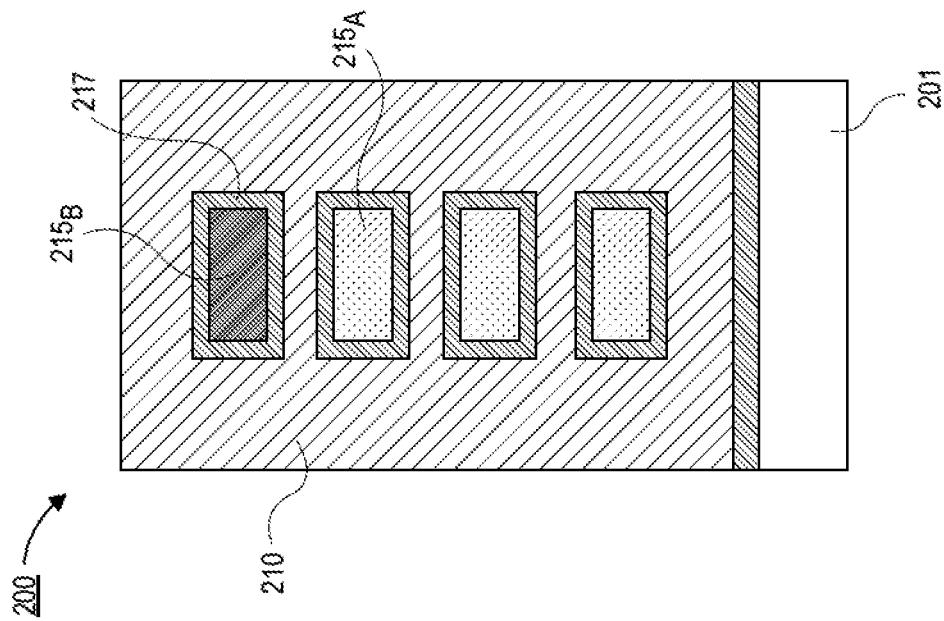
FIG. 2H is a cross-sectional illustration of the transistor after a gate electrode is disposed around the gate dielectric, in accordance with an embodiment.
Figure 2G:
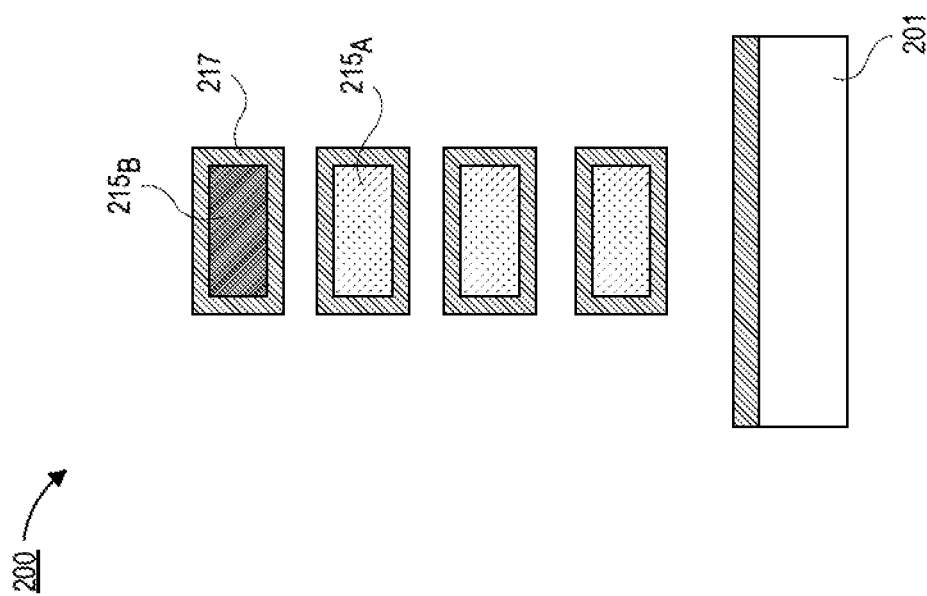
FIG. 2G is a cross-sectional illustration of the transistor after a gate dielectric is disposed around the channels, in accordance with an embodiment.

Referring now to FIG. 2G, a cross-sectional illustration of the transistor 200 after a gate dielectric 217 is disposed over the nanowire channels $215_A$ and $215_B$ is shown, in accordance with an embodiment. In an embodiment, the gate dielectric 217 may be deposited with a conformal deposition process (e.g., atomic layer deposition (ALD), or the like). The gate dielectric 217 may be any suitable gate dielectric material, such as those described above.

Referring now to FIG. 2H, a cross-sectional illustration of the transistor 200 after a gate electrode 210 is disposed over the gate dielectric 217 is shown, in accordance with an embodiment. In an embodiment, the gate electrode 210 may comprise a workfunction metal and a fill metal. Suitable material(s) for the gate electrode 210 are provided above. As shown, the depopulated second nanowire channel $215_B$ maintains a structure similar to the structure of the active first nanowire channels $215_A$. The second nanowire channel $215_B$ is rendered non-conducting by the presence of the depopulation dopants 222. Additionally, the second nanowire channels $215_B$ may be identified by having a degree of crystallinity that is lower than that of the first nanowire channels $215_A$.

Figure 3A:
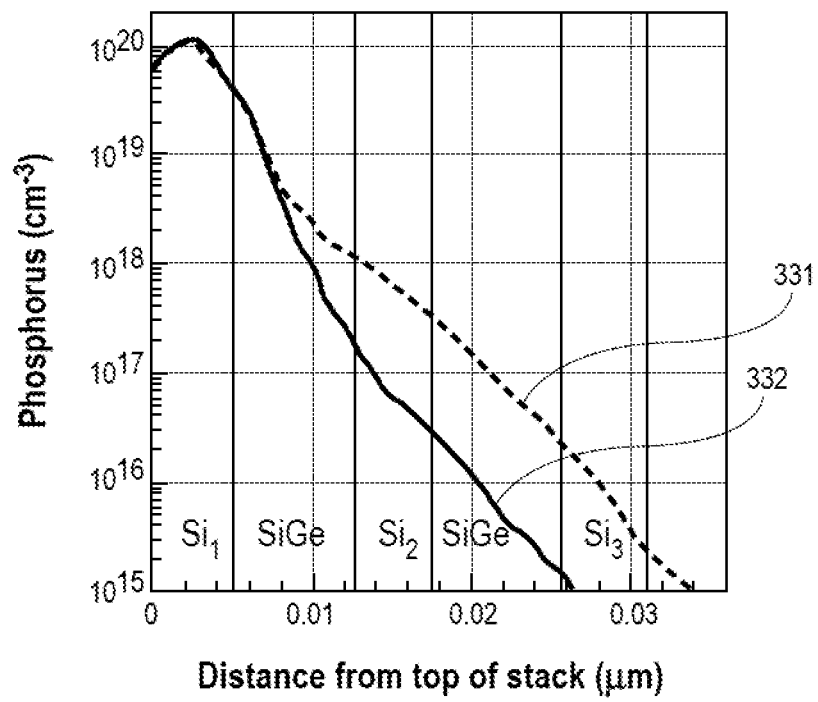
FIG. 3A is a graph of dopant concentration through the stack of channels with and without a pre-amorphization process, in accordance with an embodiment.
Figure 3B:
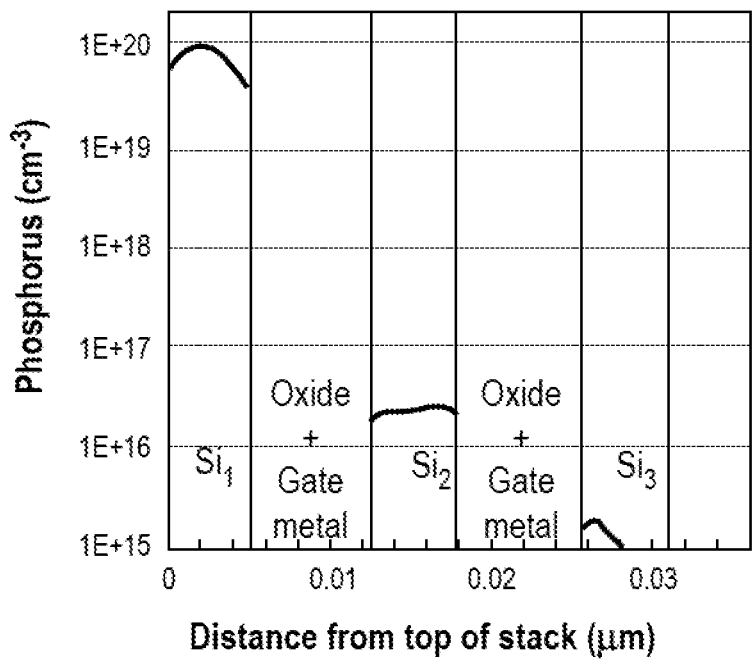
FIG. 3B is a graph that depicts the dopant concentration in various channel layers after an annealing process, in accordance with an embodiment.

Referring now to FIGS. 3A and 3B, graphs depicting the concentration of a dopant (e.g., phosphorous) with respect to depth into the stack of nanowire channels and sacrificial layers (from the top down) are shown, in accordance with various embodiments. While the dopant is listed as phosphorous in FIGS. 3A and 3B, it is to be appreciated that similar trends are exhibited with other dopant species.

FIG. 3A illustrates the effect of the pre-amorphization implant on the dopant concentration. The first line 331 illustrates the concentration of the dopant when there is no pre-amorphization implant, and the second line 332 illustrates the concentration of the dopant when there is a pre-amorphization implant. Both lines are the result after a dopant implantation with substantially the same energy. Within the first nanowire channel ($Si_1$) the concentration of the dopant is substantially similar for both lines 331 and 332. However, at the second nanowire channel ($Si_2$) the dopant concentration of the second line 332 is approximately an order of magnitude lower than the first line 331. Similarly, at the third nanowire channel ($Si_3$) the dopant concentration of the second line 332 is over an order of magnitude lower than the first line 331.

Referring now to FIG. 3B, a graph of the concentration of the dopant in the various nanowire layers after the sacrificial layers are removed and the gate dielectric and gate electrode are formed (which may include an anneal) is shown, in accordance with an embodiment. As shown, the graph is non-continuous since the sacrificial layers are replaced by the gate stack (which was not present during the dopant implantation). The remaining nanowire channels exhibit the desired depopulation of the transistor. For example, the first (topmost) nanowire channel ($Si_1$) has concentration of dopants that is approximately $1e20$ $cm^3$, and the next nanowire channel ($Si_2$) has a concentration of dopants that is between $1e16$ $cm^{-3}$ and $1e17$ $cm^{-3}$. That is the next nanowire channel ($Si_2$) has a concentration of dopants that is approximately 3 orders of magnitude lower than the concentration of dopants in the first nanowire channel ($Si_1$). As such, the first nanowire channel ($Si_1$) is rendered non-conducting (i.e., depopulated), and the remaining nanowire channels (e.g., $Si_2$, $Si_3$, etc.) have a dopant concentration that is sufficiently low so that the remaining nanowire channels still function normally.

In an embodiment, in order to engineer different devices having different drive-current strengths, a top-down depopulation process flow can be implemented using lithography so that nanowire channels are depopulated only from specific devices. In an embodiment, the entire wafer may be depopulated uniformly so all devices have same number of nanowire channels. Examples of selective depopulation are shown in FIGS. 4A-4C.

Figure 4A:
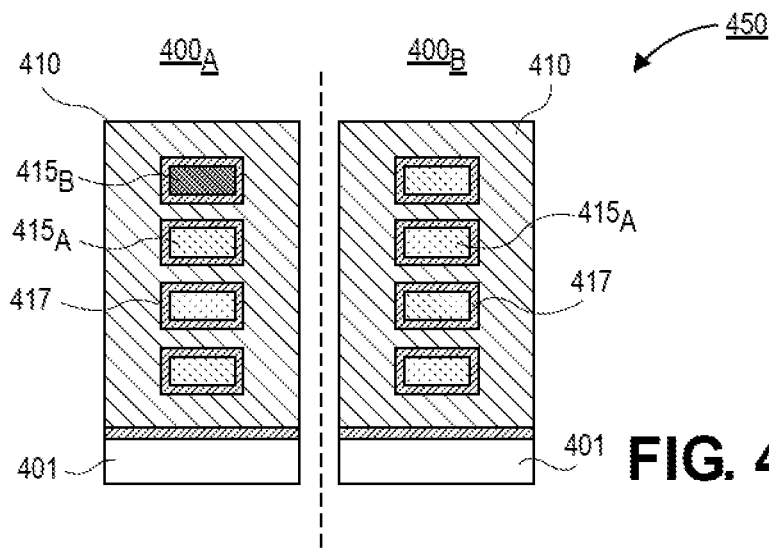
FIGS. 4A-4C are cross-sectional illustrations of an integrated circuit device that includes a first transistor and a second transistor, where the number of active channels is different between the two transistors, in accordance with various embodiments.

Referring now to FIG. 4A, a cross-sectional illustration depicting portions of a semiconductor device 450 is shown, in accordance with an embodiment. In an embodiment, the semiconductor device 450 may comprise a first transistor $400_A$ and a second transistor $400_B$. In an embodiment, individual ones of the first transistor $400_A$ and the second transistor $400_B$ may be disposed over a substrate 401 and comprise a plurality of nanowire channels 415 surrounded by a gate dielectric 417 and a gate electrode 410.

In an embodiment, the first transistor $400_A$ may comprise first nanowire channels $415_A$ and a second nanowire channel $415_B$. The first nanowire channels $415_A$ are active channels and the second nanowire channel $415_B$ is a depopulated (i.e., non-active) channel. In the particular embodiment illustrated in FIG. 4A, there are three first nanowire channels $415_A$ and a single second nanowire channel $415_B$. In an embodiment, the second transistor $400_B$ may include only active first nanowire channels $415_A$. In an embodiment, the total number of nanowire channels 415 in the first transistor $400_A$ (e.g., four—three active first nanowire channels $415_A$ and one depopulated second nanowire channel $415_B$) is equal to the number of nanowire channels 415 in the second transistor $400_B$. Due to the lower number of active first nanowire channels $415_A$, the drive current of the first transistor $400_A$ is lower than the drive current of the second transistor $400_B$.

Figure 4B:
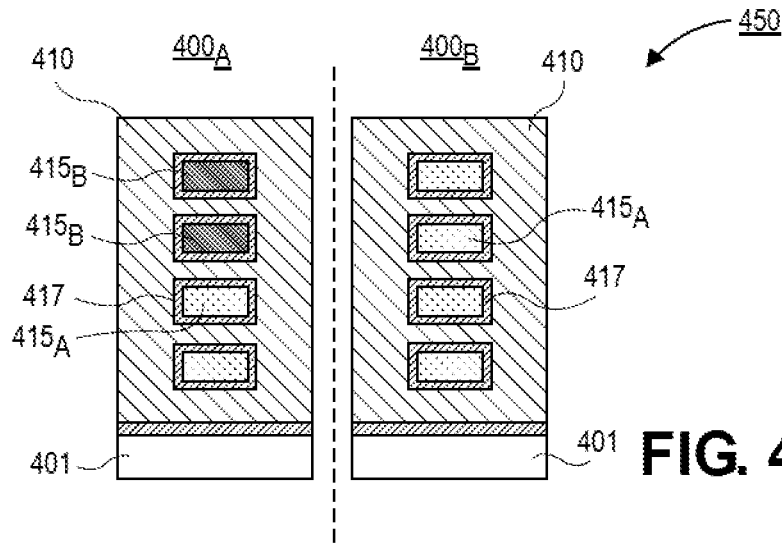
Figure 4C:
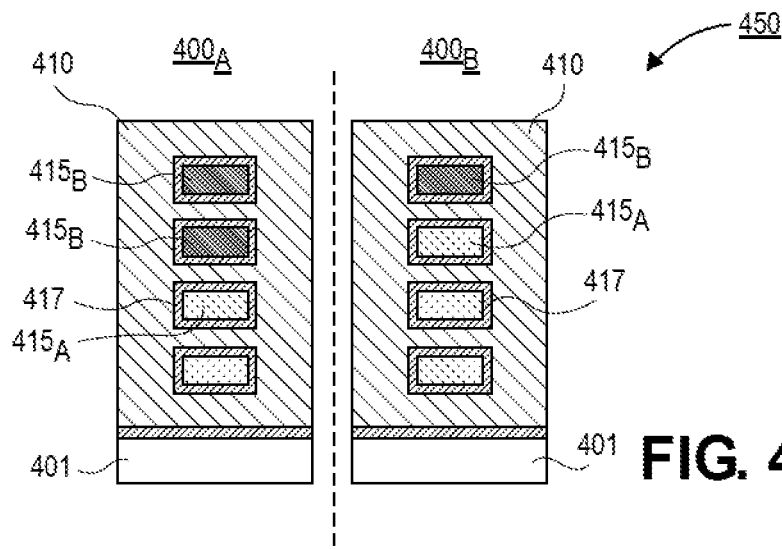

Referring now to FIG. 4B, a cross-sectional illustration depicting portions of a semiconductor device 450 is shown, in accordance with an additional embodiment. The semiconductor device 450 in FIG. 4B is substantially similar to the semiconductor device 450 in FIG. $4_A$, with the exception that the first transistor $400_A$ comprises a pair of depopulated second nanowire channels $415_B$. As such, an even greater difference is provided between the drive current of the first transistor $400_A$ and the drive current of the second transistor $400_B$.

Referring now to FIG. 4C, a cross-sectional illustration depicting portions of a semiconductor device 450 is shown, in accordance with an additional embodiment. The semiconductor device 450 in FIG. 4C is substantially similar to the semiconductor device 450 in FIG. 4B, with the exception that the second transistor $400_B$ also comprises a depopulated second nanowire channel $415_B$. Accordingly, the first transistor $400_A$ and the second transistor $400_B$ may have different drive currents, as well as both transistors $400_A$ and $400_B$ having a different drive current than a transistor (not shown)

without any depopulated channels. This provides further flexibility in designing circuitry of the semiconductor device 450.

In the embodiments disclosed above, a top-down depopulation scheme is described. However, embodiments are not limited to such depopulation schemes. For example, embodiments disclosed herein may also utilize a bottom-up depopulation scheme. In the bottom-up depopulation schemes described herein, the depopulated nanowire channel is completely removed from the stack of nanowire channels. This is in contrast to the top-down approach where the bulk structure of the depopulated nanowire channel is maintained while only changing electrical conductivity of the nanowire.

Figure 5A:
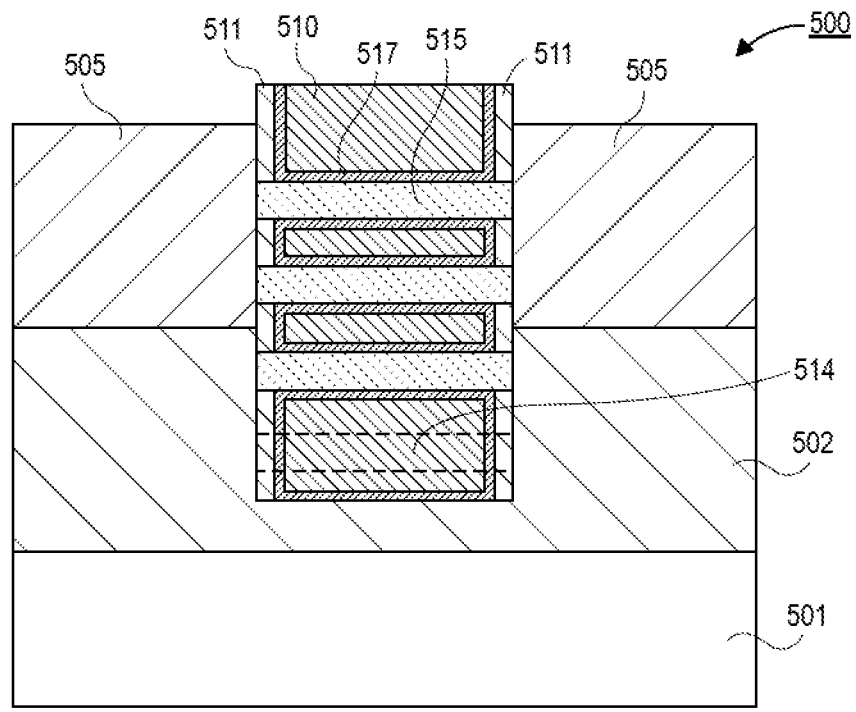
FIG. 5A is a cross-sectional illustration of a transistor with a depopulated region below a stack of channels, in accordance with an embodiment.

Referring now to FIG. 5A, a cross-sectional illustration of a transistor 500 formed with a bottom-up depopulation scheme is shown, in accordance with an embodiment. In an embodiment, the transistor 500 may comprise a substrate 501. Source/drain regions 505 may be separated from the substrate 501 by an insulator 502 and be positioned on either end of a gate stack. The gate stack may cover the nanowire channels 515 that connect the source/drain regions 505 together. The gate stack may comprise a gate dielectric 517 and a gate electrode 510. Spacers 511 may separate the gate electrode 510 from the source/drain regions 505. Suitable materials for the source/drain regions 505, the gate dielectric 517, and the gate electrode 510 are similar to those described above.

As shown, the stack of nanowire channels 515 includes a depopulated region 514. The depopulated region 514 (indicated with dashed lines) is the location where the bottommost semiconductor channel would otherwise be located if it was not depopulated (i.e., removed). In an embodiment, the depopulated region 514 may comprise portions of the gate electrode 510. Furthermore, the positioning and structure of the remaining nanowire channels 515 are not changed. That is, the spacings between the remaining nanowire channels 515 and the substrate 501 is not changed by removing one or more of the nanowire channels 515.

Figure 5B:
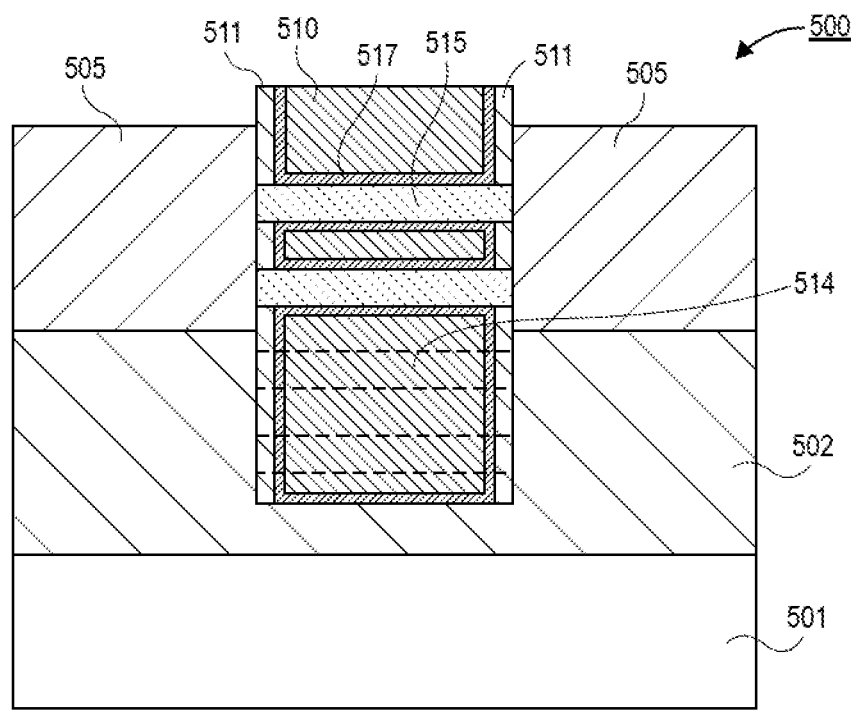
FIG. 5B is a cross-sectional illustration of a transistor with a pair of depopulated region below a stack of channels, in accordance with an embodiment.

Referring now to FIG. 5B, a cross-sectional illustration of a transistor 500 formed with a bottom-up depopulation scheme is shown, in accordance with an additional embodiment. The transistor 500 in FIG. 5B is substantially similar to the transistor 500 in FIG. 5A, with the exception that an additional depopulated region 514 is provided. That is, two nanowire channels 515 have been depopulated (i.e., removed). While the depopulation of one and two nanowire channels 515 are shown in FIGS. 5A and 5B, respectively, it is to be appreciated that any number of nanowire channels 515 may be depopulated in order to provide a desired drive current to the transistor, in accordance with an embodiment.

Referring now to FIGS. 6A-6D, a series of cross-sectional illustrations depicting a process for implementing a bottom-up depopulation scheme is provided, in accordance with an embodiment. For each of the FIGS. 6A, 6B, 6C and 6D, a gate cut cross-sectional view (left-hand side), a fin cut on source or drain (S/D) cross-sectional view (middle), and a fin cut on gate cross-sectional view (right-hand side), are illustrated.

Figure 6A:
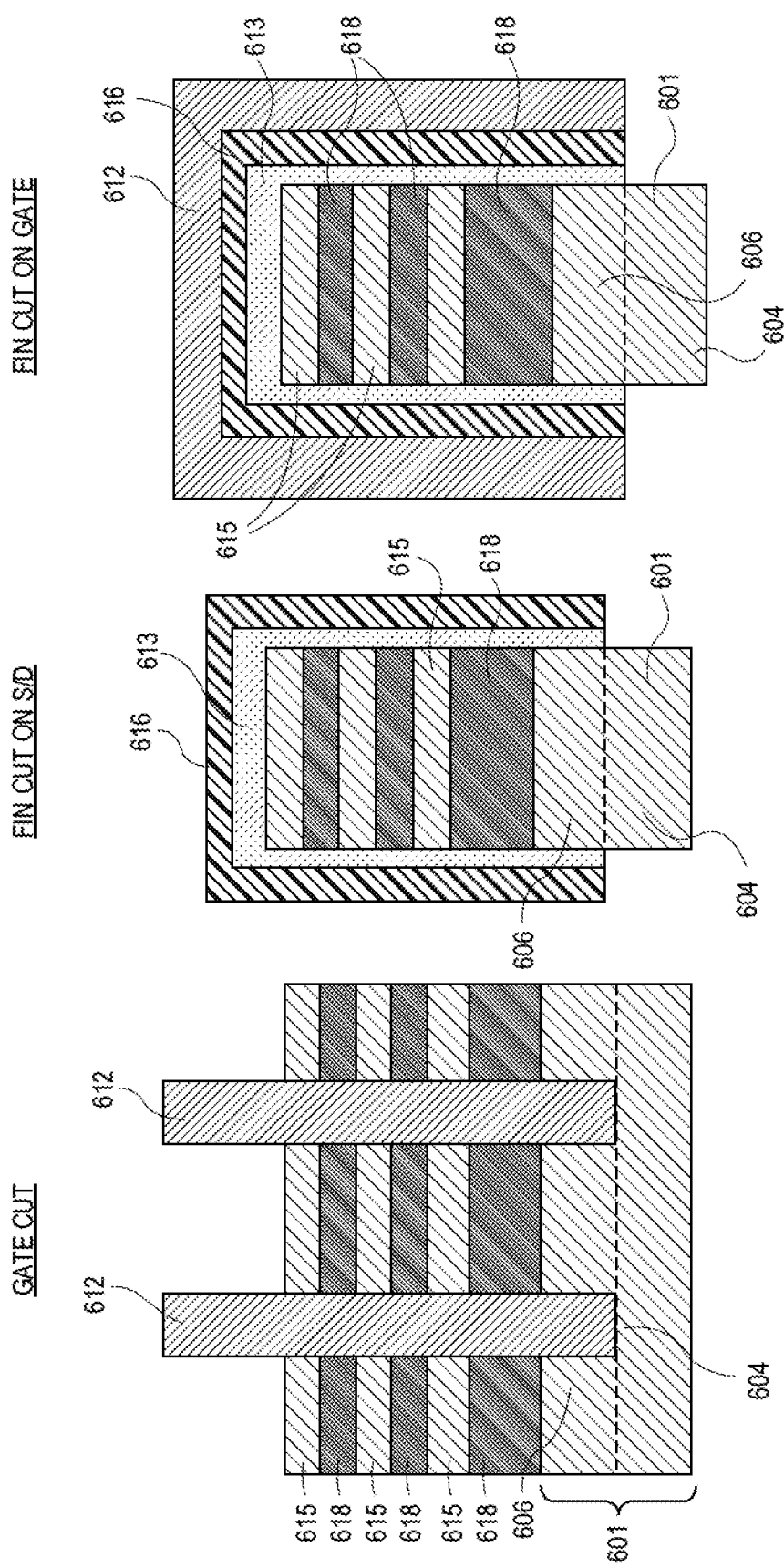
FIGS. 6A-6D are cross-sectional illustrations of a process for forming a depopulated region in a stack of channels, in accordance with an embodiment.

Referring to FIG. 6A, a starting stack includes a fin of alternating silicon germanium layers 618 and silicon layers 615 above a substrate 601, which may be or include a silicon fin. In the case that substrate 601 includes or is a silicon fin, an upper fin portion 606 may be above a lower fin portion 604, as delineated by the height of a shallow trench isolation structure (not depicted). The silicon layers 615 may be referred to as a vertical arrangement of silicon nanowires. The bottommost silicon germanium layer 618 may be thicker than upper silicon germanium layers 618, as is depicted.

Referring again to FIG. 6A, a dielectric liner 613, such as a dummy gate oxide liner composed of silicon oxide, is over the fin of alternating silicon germanium layers 618 and silicon layers 615. A protective cap layer 616, such as a silicon nitride or titanium nitride cap layer, may be formed on the dielectric liner 613. It is to be appreciated that for clarity, the dielectric liner 613 and the protective cap layer 616 are not depicted in the gate cut image (left), but would be present over the structure. Gate stacks 612, such as sacrificial or dummy gate stacks composed of polysilicon or a silicon nitride pillar, are formed over the dielectric liner 613 and the protective cap layer 616 over the alternating silicon germanium layers 618 and silicon layers 615. Although the preceding describes using Si and SiGe layers, other pairs of semiconductor materials which can be alloyed and grown epitaxially could be implemented to achieve various embodiments herein, for example, InAs and InGaAs, or SiGe and Ge.

Figure 6B:
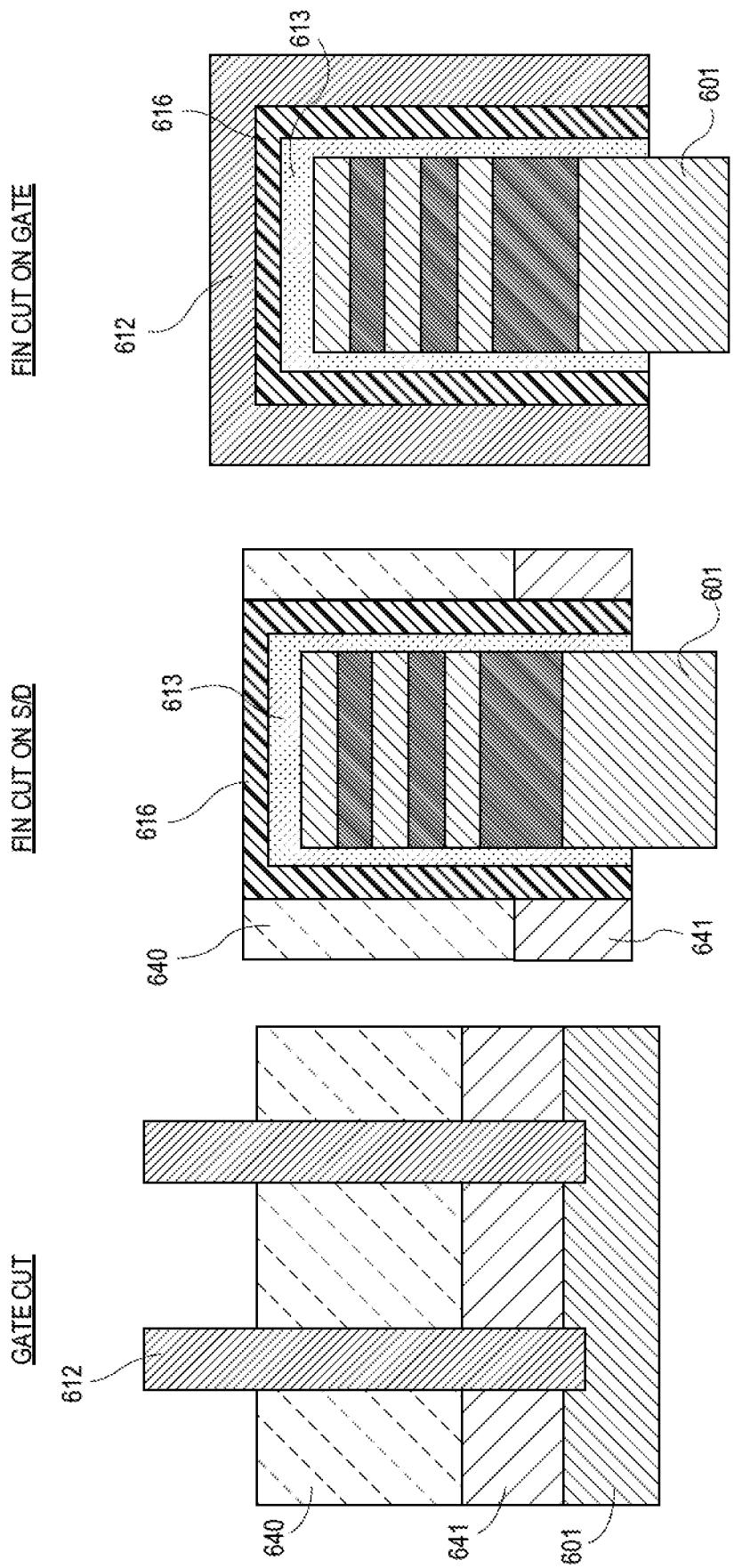

Referring to FIG. 6B, a masking stack is formed over the structure of FIG. 6A not covered by gate stacks 612. In an embodiment, the masking stack includes a lower layer 641 and an upper layer 640. In one embodiment, the lower layer 641 is a carbon-based hardmask layer which is deposited and then recessed to a desired level. For example, the level may be approximately aligned with the bottommost silicon germanium layer 618, as is depicted. In one embodiment, upper layer 640 is composed of a metal-based hardmask, such as a titanium nitride layer. The upper layer 640 is recessed to expose the protective cap layer 616.

Figure 6C:
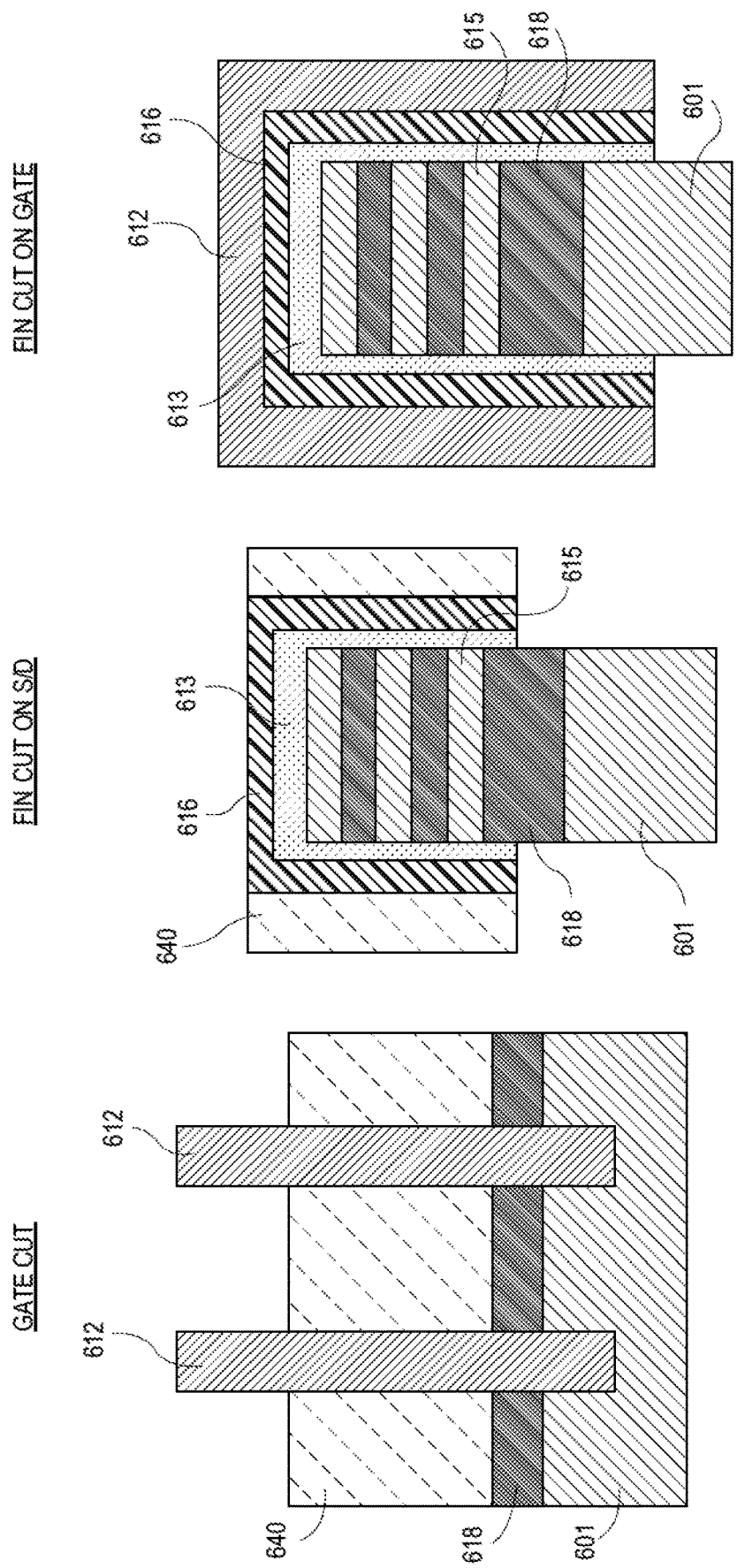

Referring to FIG. 6C, the lower layer 641 of the masking stack of the structure of FIG. 6B is removed, e.g., by a selective wet etch process. Additionally, the lower portions of the dielectric liner 613 and the protective cap layer 616 exposed upon removing the lower layer 641 of the masking stack are removed, e.g., by further selective etch processes. Removal of the lower layer 641 and the lower portions of the dielectric liner 613 and the protective cap layer 616 exposes at least a portion of the bottommost silicon germanium layer 618.

Figure 6D:
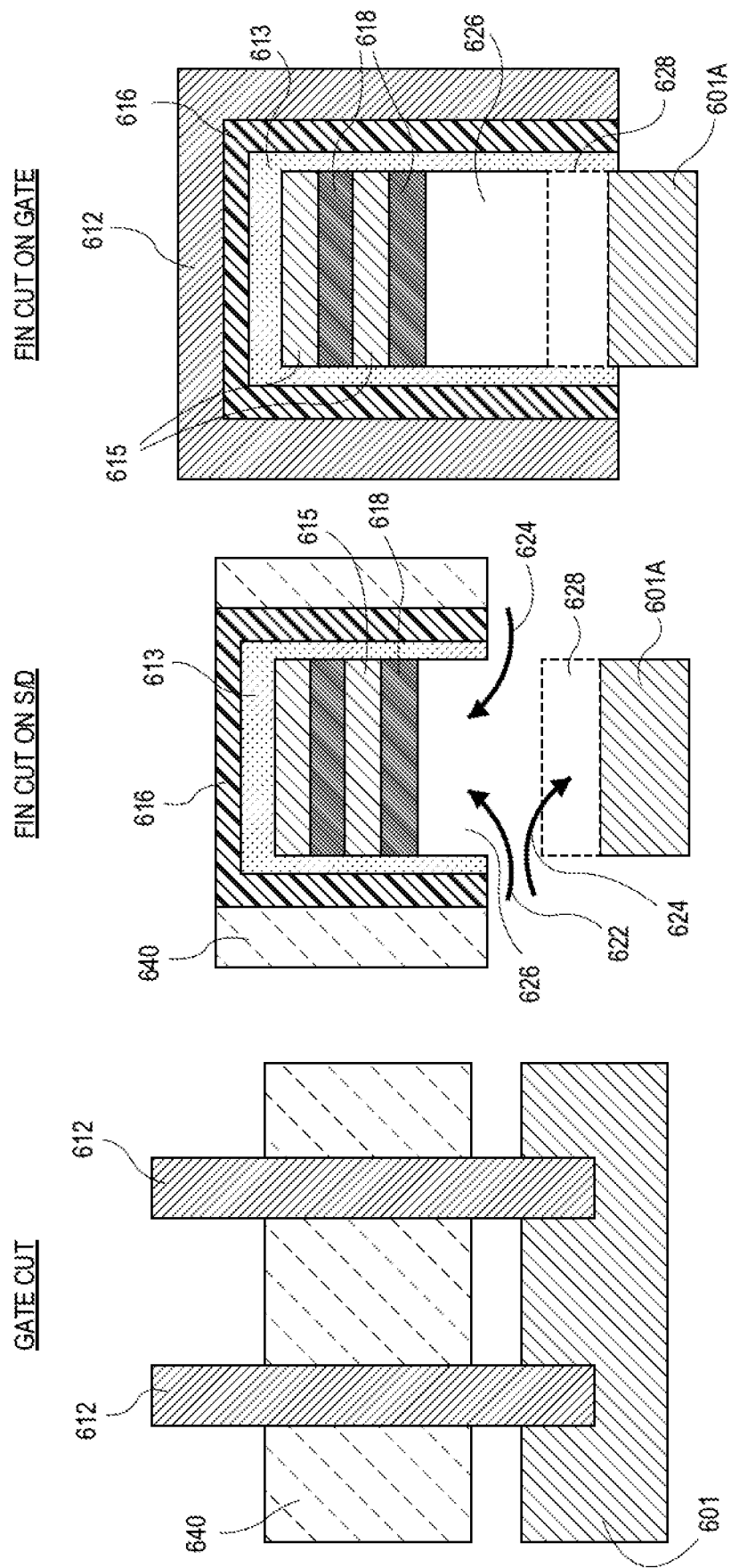

Referring to FIG. 6D, the bottommost silicon germanium layer 618 is removed. The bottommost silicon germanium layer 618 may be removed by a selective etch process 622 that etches silicon germanium selective to silicon. Following removal of the bottommost silicon germanium layer 618, the bottommost silicon layer 615 is then removed. The bottommost silicon layer 615 may be removed by a selective etch process 624 that etches silicon selective to silicon germanium. The result is effective removal (or depopulation) of a bottommost silicon nanowire. It is to be appreciated that the etch 624 used to remove the bottommost silicon layer 615 may remove a portion 628 of the substrate of fin 601 to leave a partially etched fin or substrate 601A, as is depicted. Also, in an embodiment, the above process may be repeated to remove the next bottommost wire, and so on, until desired depopulation is achieved.

In an embodiment, the silicon germanium layer is etched selectively with a wet etch that selectively removes the silicon germanium while not etching the silicon layers. Etch chemistries such as carboxylic acid/nitric acid/HF chemistry, and citric acid/nitric acid/HF, for example, may be utilized to selectively etch the silicon germanium. In an embodiment, silicon layers are etched selectively with a wet etch that selectively removes the silicon while not etching the silicon germanium layers. Etch chemistries such as aqueous hydroxide chemistries, including ammonium hydroxide and potassium hydroxide, for example, may be utilized to selectively etch the silicon. Halide-based dry etches or plasma-enhanced vapor etches may also be used to achieve the embodiments herein.

It is to be appreciated that following the processing described in association with FIG. 6D, an insulating or dielectric material (shown in FIG. 5A and FIG. 5B as insulator 502) may be formed in the location 626 where channel depopulation is performed. Also, a permanent gate dielectric and a permanent gate electrode may be formed upon removal of gate structures 612.

In an embodiment, in order to engineer different devices having different drive-current strengths, a bottom-up depopulation process flow can be patterned with lithography so that nanowire channels are depopulated only from specific devices. In an embodiment, the entire wafer may be depopulated uniformly so all devices have same number of nanowire channels. Examples of selective depopulation are provide in FIGS. 7A-7C.

Figure 7A:
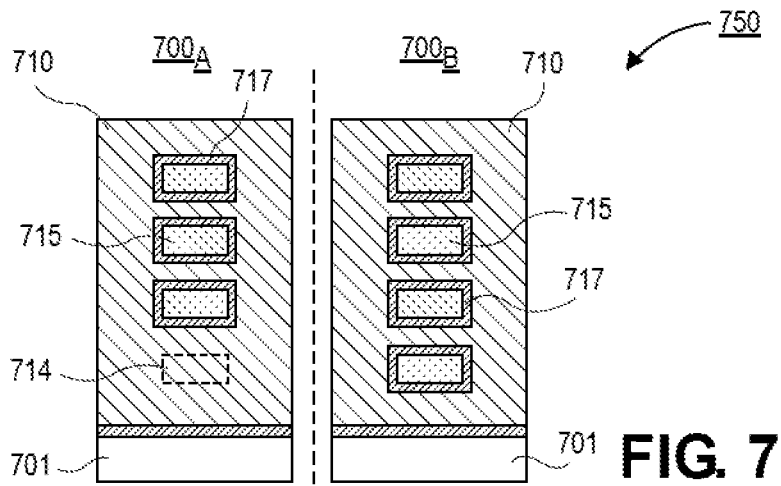
FIG. 7A-7E are cross-sectional illustrations of integrated circuit devices that include a first transistor and a second transistor, where the number of active channels is different between the two transistors, in accordance with various embodiments.

Referring now to FIG. 7A, a cross-sectional illustration depicting portions of a semiconductor device 750 is shown, in accordance with an embodiment. In an embodiment, the semiconductor device 750 may comprise a first transistor $700_A$ and a second transistor $700_B$. In an embodiment, individual ones of the first transistor $700_A$ and the second transistor $700_B$ may be disposed over a substrate 701 and comprise a plurality of nanowire channels 715 surrounded by a gate dielectric 717 and a gate electrode 710.

In an embodiment, the first transistor $700_A$ may comprise three nanowire channels 715, and the second transistor $700_B$ may comprise four nanowire channels 715. Having fewer nanowire channels 715 results in the first transistor $700_A$ having a lower drive current than second transistor $700_B$. In the first transistor $700_A$ a depopulated region 714 is positioned below the three nanowire channels 715. The depopulated region 714 is aligned in the Z-direction with the bottommost nanowire channel 715 of the second transistor $700_B$. The remaining nanowire channels 715 of the first transistor $700_A$ are each aligned (in the Z-direction) with one of the nanowire channels 715 of the second transistor $700_B$. For example, the topmost nanowire channel 715 in the first transistor $700_A$ is aligned with the topmost nanowire channel 715 in the second transistor $700_B$.

Figure 7B:
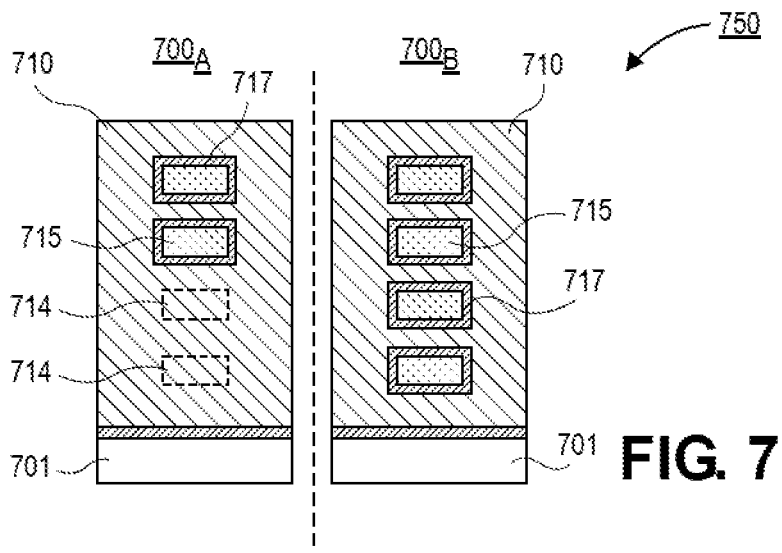

Referring now to FIG. 7B, a cross-sectional illustration depicting portions of a semiconductor device 750 is shown, in accordance with an additional embodiment. The semiconductor device 750 in FIG. 7B is substantially similar to the semiconductor device 750 in FIG. 7A, with the exception that the first transistor $700_A$ comprises a pair of depopulated regions 714. As such, an even greater difference is provided between the drive current of the first transistor $700_A$ and the drive current of the second transistor $700_B$.

Figure 7C:
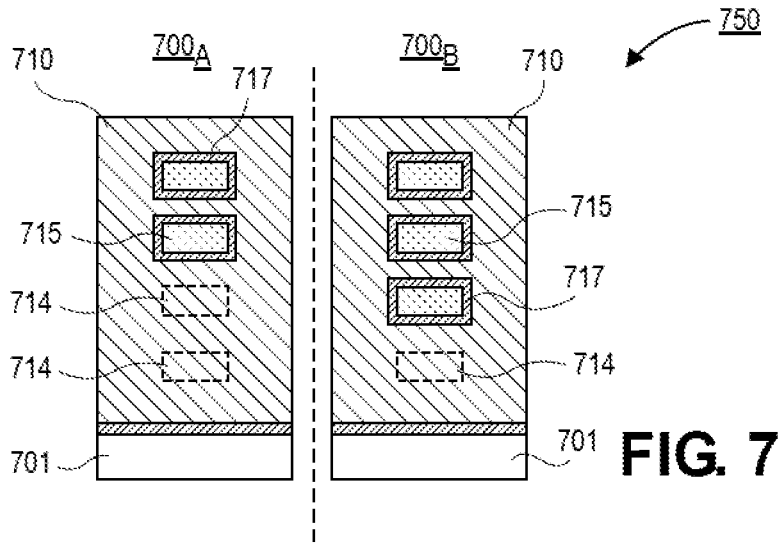

Referring now to FIG. 7C, a cross-sectional illustration depicting portions of a semiconductor device 750 is shown, in accordance with an additional embodiment. The semiconductor device 750 in FIG. 7C is substantially similar to the semiconductor device 750 in FIG. 7B, with the exception that the second transistor $700_B$ also comprises a depopulated region 714. Accordingly, the first transistor $700_A$ and the second transistor $700_B$ may have different drive currents, as well as both transistors $700_A$ and $700_B$ having a different drive current than a transistor (not shown) without any depopulated regions. This provides further flexibility in designing circuitry of the semiconductor device 750.

In the embodiments described above the depopulation architectures were described as including either top-down or bottom-up process flows. However, it is to be appreciated that in some embodiments a combination of both process flow may be provided. Examples of such semiconductor device 750 are provided in FIGS. 7D and 7E.

Figure 7D:
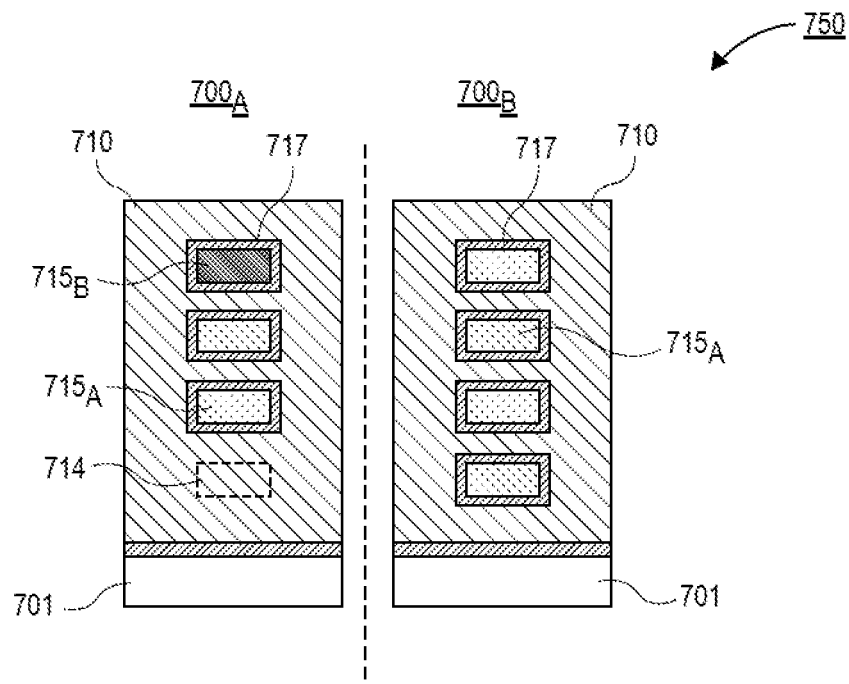

Referring now to FIG. 7D, a cross-sectional illustration of a semiconductor device 750 is shown, in accordance with an embodiment. In an embodiment, the semiconductor device 750 comprises a first transistor $700_A$ and a second transistor $700_B$. The second transistor $700_B$ comprises only active first nanowire channels $715_A$. The first transistor $700_A$ may comprise active first nanowire channels $715_A$, a depopulated second nanowire channel $715_B$, and a depopulated region 714. For example, the depopulated second nanowire channel $715_B$ may be doped with a depopulation dopant (e.g., using a top-down process flow), and the depopulated region 714 may be formed using a bottom-up process flow.

Figure 7E:
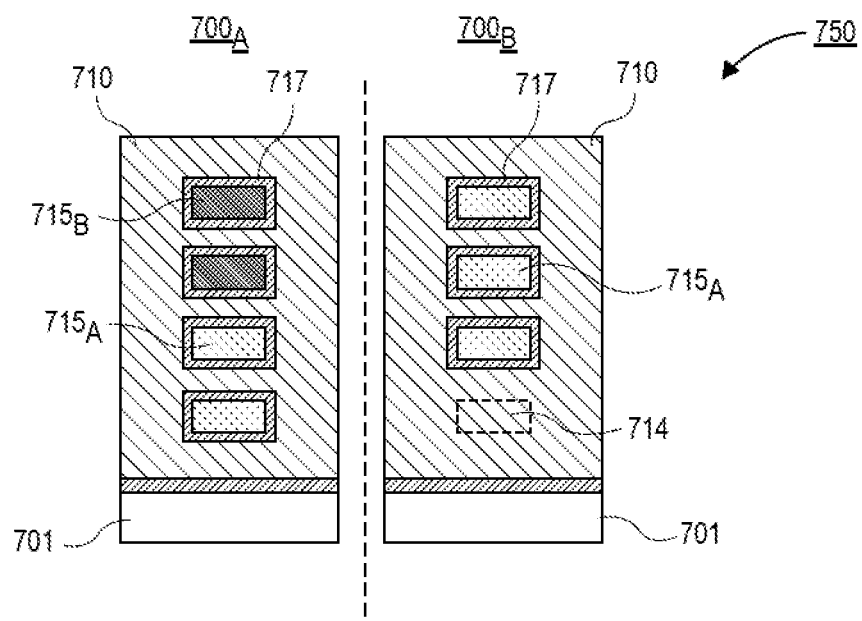

Referring now to FIG. 7E, a cross-sectional illustration of a semiconductor device 750 is shown, in accordance with an additional embodiment. In an embodiment, the first transistor $700_A$ may comprise one or more depopulated second nanowire channels $715_B$, and the second transistor $700_A$ may comprise one or more depopulated regions 714. That is, within a single device, individual transistors 700 may be depopulated using either a top-down process flow or a bottom-up process flow.

Figure 8:
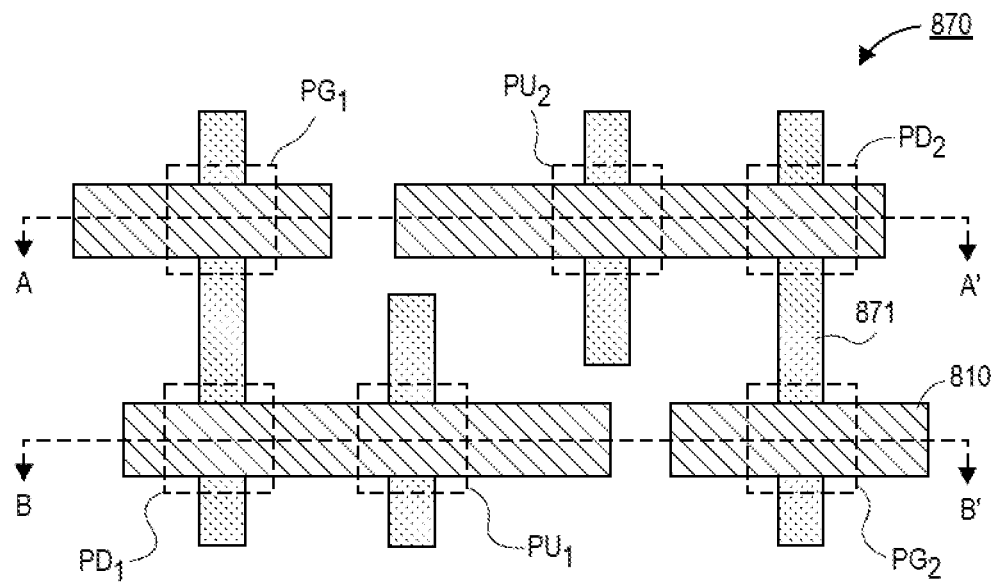
FIG. 8 is a plan view layout of a six-transistor (6-T) SRAM cell that includes a non-uniform number of active channels for the transistors, in accordance with an embodiment.

The ability to provide modulated drive current between different transistors within a single device allows for improved flexibility in circuit design. Additionally, assist circuitry may not be needed in order to accommodate uniform drive currents between transistors. The ability to modulate drive current is particularly beneficial in the design of SRAM cells. An example of such a 6-T SRAM cell 870 is shown in FIG. 8. As shown, a plurality of fins 871 and gate electrodes 810 are interconnected to form the 6-T SRAM cell 870.

In an embodiment, the cell 870 comprises a pair of PMOS pull-up transistors ($PU_1$ and $PU_2$), a pair of NMOS pass-gate transistors ($PG_1$ and $PG_2$), and a pair of NMOS pull-down transistors ($PD_1$ and $PD_2$). In a typical architecture (i.e., where all transistors have the same number of nanowire channels), the read stability and write-ability is unbalanced, and assist circuitry (not shown) is needed. However, in embodiments disclosed herein, the $PU_1$ and $PU_2$ transistors may be depopulated in order to reduce the drive strength of the PU transistors compared to that of the PD and PG transistors. As such, better balance between the read stability and write-ability is provided. This eliminates the need for assist circuits, and therefore, saves the corresponding chip area and power consumption.

Figure 9A:
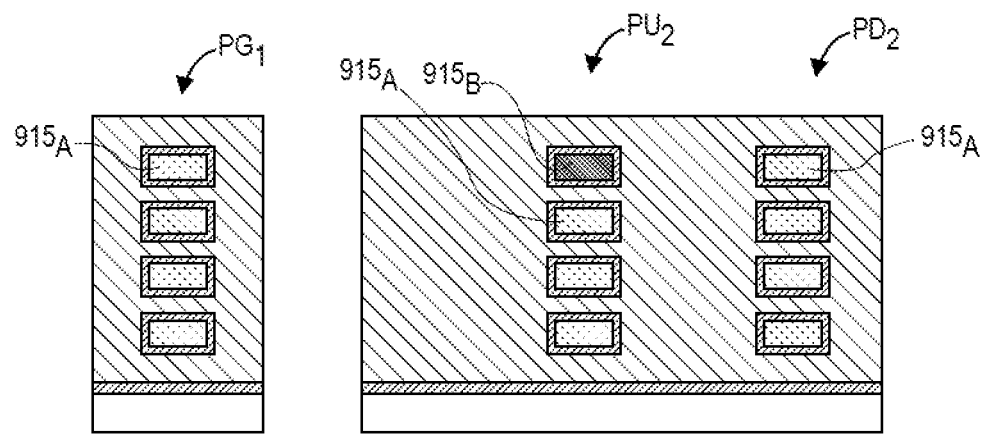
FIGS. 9A and 9B are cross-sectional illustrations of the 6-T SRAM cell that includes channels that are depopulated by doping processes, in accordance with an embodiment.
Figure 9B:
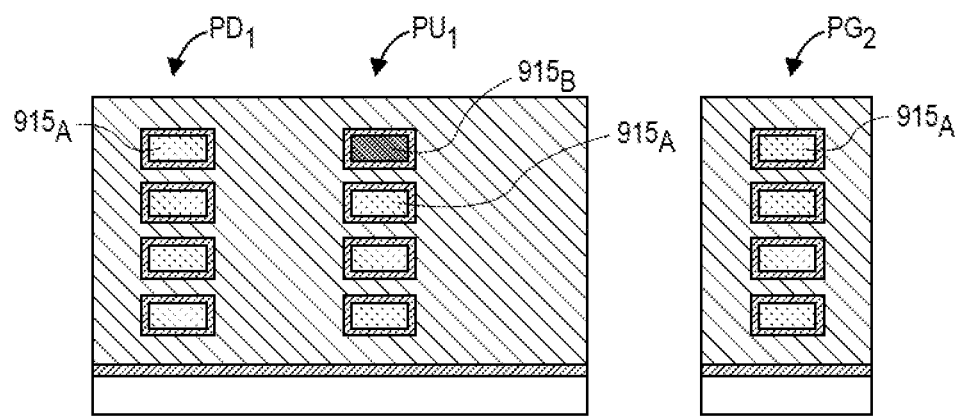

Referring now to FIGS. 9A and 9B, cross-sectional illustrations of the cell 870 along lines A-A' and B-B' are shown, respectively, in accordance with an embodiment that utilizes a top-down depopulation scheme. As shown, the $PG_1$, $PG_2$, $PD_1$, and $PD_2$ transistors each have four active first nanowire channels $915_A$. The $PU_1$ and $PU_2$ transistors each have a depopulated second nanowire channel $915_B$ and three active first nanowire channels $915_A$ below the second nanowire channel $915_B$. The depopulated second nanowire channels $915_B$ may be implemented using processes described above. For example, the second nanowire channels $915_B$ may comprise a depopulation dopant with a concentration of approximately 1e19 $cm^{-3}$ or greater, or approximately 1e20 $cm^{-3}$ or greater.

Figure 10A:
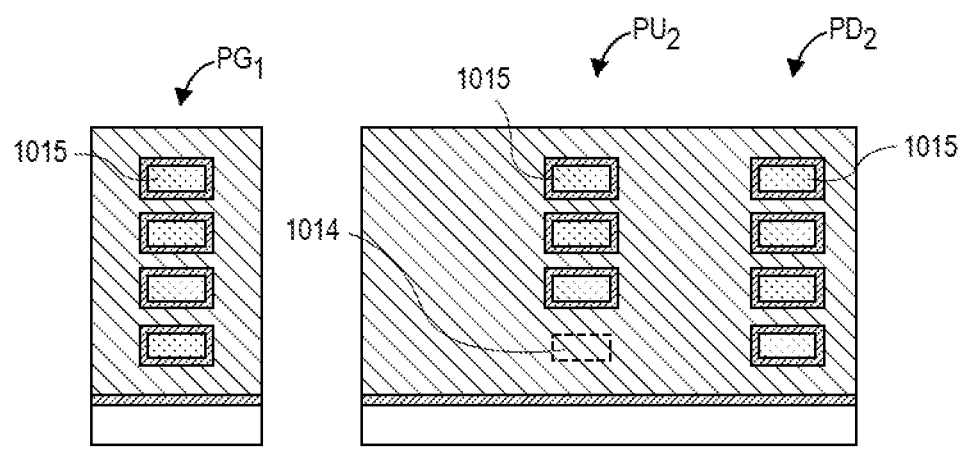
FIGS. 10A and 10B are cross-sectional illustrations of the 6-T SRAM cell that includes channels that are depopulated by etching processes, in accordance with an embodiment.
Figure 10B:
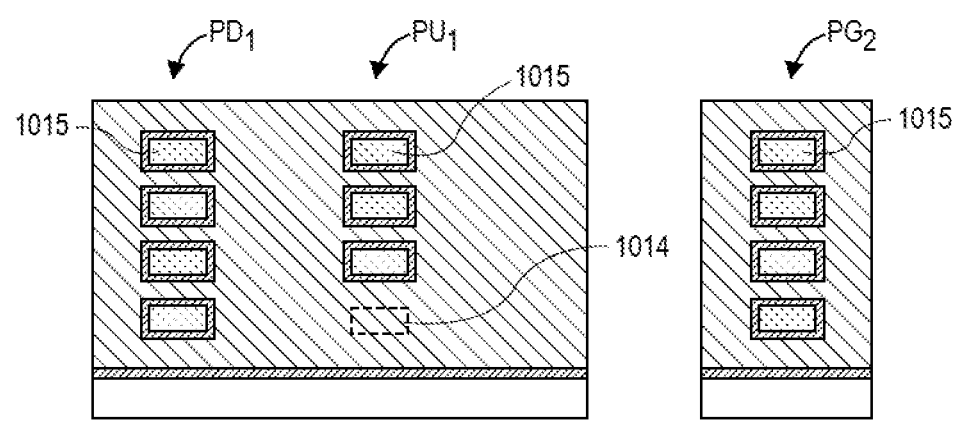

Referring now to FIGS. 10A and 10B, cross-sectional illustrations of the cell 870 along lines A-A' and B-B' are shown, respectively, in accordance with an embodiment that utilizes a bottom-up depopulation scheme. As shown, the PG$_1$, PG$_2$, PD$_1$, and PD$_2$ transistors each have four active nanowire channels 1015. The PU$_1$ and PU$_2$ transistors each have a depopulated region 1014 and three nanowire channels 1015 above the depopulated region 1014. The depopulated region 1014 is substantially aligned with the bottom-most nanowire channels 1015 of the other transistors.

Figure 11:
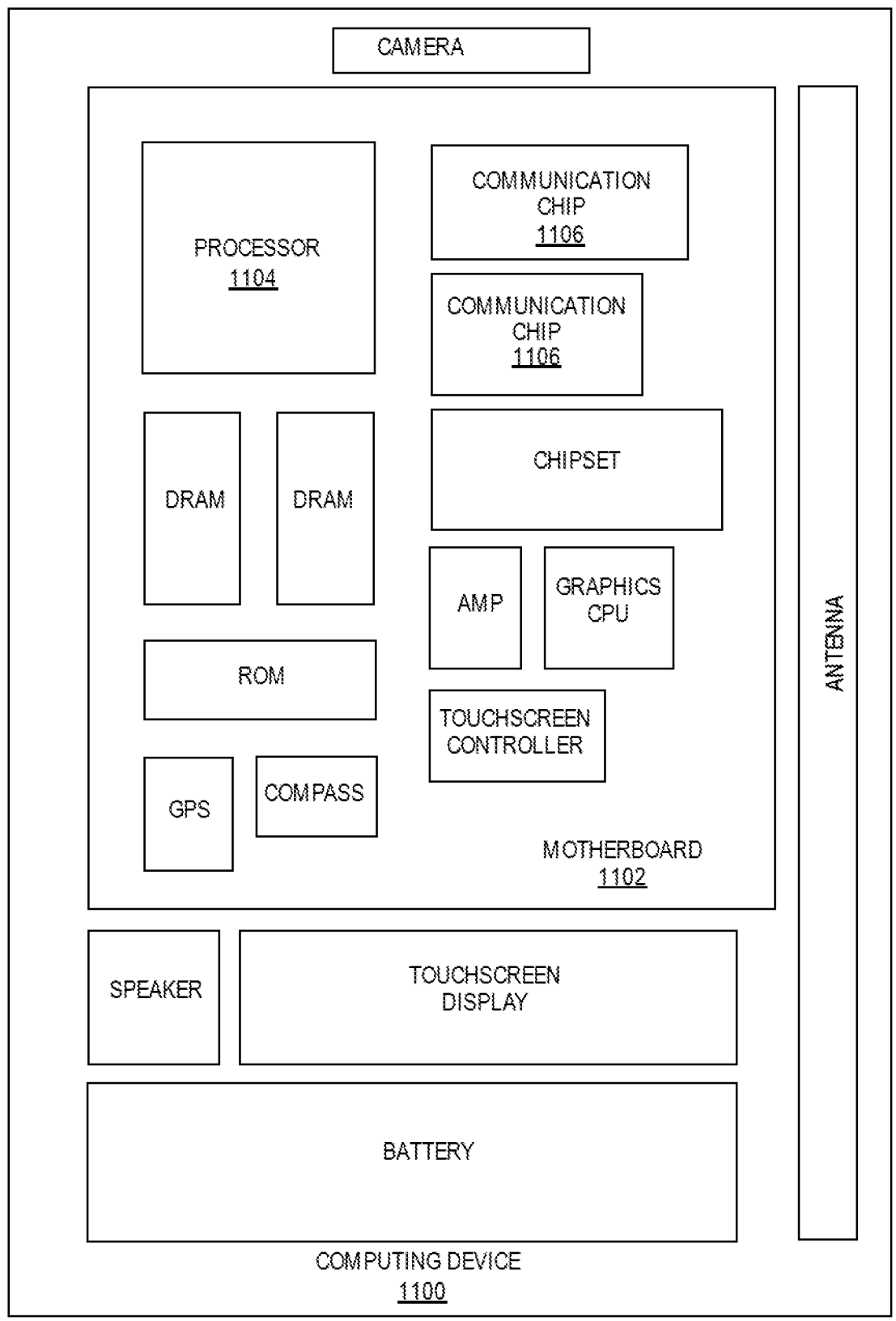
FIG. 11 illustrates a computing device in accordance with one implementation of an embodiment of the disclosure.

FIG. 11 illustrates a computing device 1100 in accordance with one implementation of an embodiment of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In an embodiment, the integrated circuit die of the processor 1104 may comprise nanowire or nanoribbon transistors with one or more depopulated channels, such as those described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In an embodiment, the integrated circuit die of the communication chip 1106 may comprise nanowire or nanoribbon transistors with one or more depopulated channels, such as those described herein.

In further implementations, another component housed within the computing device 1100 may comprise nanowire or nanoribbon transistors with one or more depopulated channels, such as those described herein.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
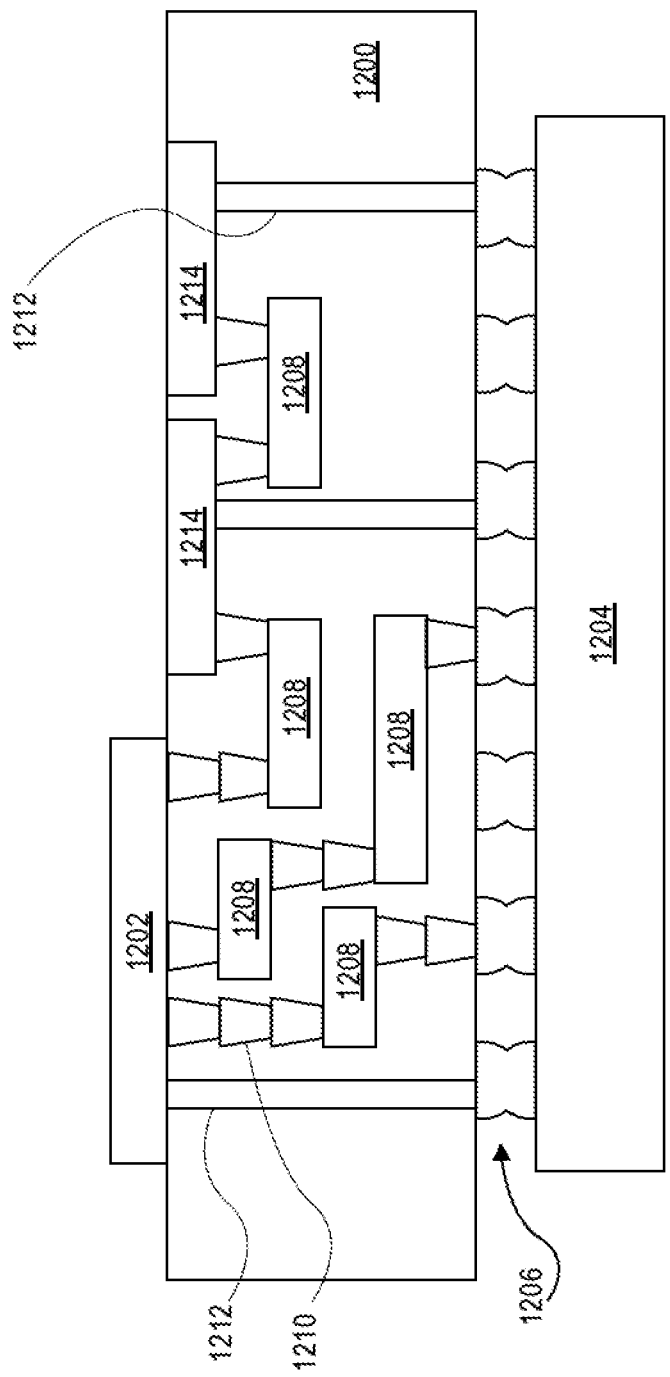
FIG. 12 is an interposer implementing one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. In an embodiment, one of both of the first substrate 1202 and the second substrate 1204 may comprise nanowire or nanoribbon transistors with one or more depopulated channels, in accordance with embodiments described herein. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials The interposer 1200 may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200.

Thus, embodiments of the present disclosure may comprise nanowire or nanoribbon transistors with one or more depopulated channels, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a transistor device, comprising: a source region; a drain region; and a vertical stack of semiconductor channels between the source region and the drain region, wherein the vertical stack of semiconductor channels comprises: first semiconductor channels; and a second semiconductor channel over the first semiconductor channels, wherein first concentrations of a dopant in the first semiconductor channels are less than a second concentration of the dopant in the second semiconductor channel.

Example 2: the transistor device of Example 1, wherein the second concentration of the dopant is approximately $1e19$ $cm^{-3}$ or greater.

Example 3: the transistor device of Example 2, wherein the first concentrations of the dopant are at least three orders of magnitude lower than the second concentration of the dopant.

Example 4: the transistor device of Examples 1-3, wherein the transistor device is a P-type device, and wherein the dopant is an N-type dopant.

Example 5: the transistor device of Example 4, wherein the dopant is phosphorus or arsenic.

Example 6: the transistor device of Examples 1-3, wherein the transistor device is an N-type device, and wherein the dopant is a P-type dopant.

Example 7: the transistor device of Example 6, wherein the dopant is boron or gallium.

Example 8: the transistor device of Examples 1-7, wherein the second semiconductor channel further comprises a pre-amorphization dopant.

Example 9: the transistor device of Example 8, wherein the pre-amorphization dopant is germanium.

Example 10: the transistor device of Examples 1-9, wherein the first semiconductor channels have a first degree of crystallinity that is higher than a second degree of crystallinity of the second semiconductor channel.

Example 11: the transistor device of Examples 1-10, wherein the vertical stack of semiconductor channels further comprises a third semiconductor channel between the first semiconductor channels and the second semiconductor channel, wherein a third concentration of the dopant in the third semiconductor channel is greater than the first concentrations of the dopant in the first semiconductor channels.

Example 12: the transistor device of Examples 1-11, wherein the first semiconductor channels and the second semiconductor channel are nanoribbons or nanowires.

Example 13: an integrated circuit structure, comprising: a first transistor, wherein the first transistor comprises: a first stack of semiconductor channels, wherein a first number of active channels are in the first stack; and s second transistor, wherein the second transistor comprises: a second stack of semiconductor channels, wherein a second number of active channels in the second stack is smaller than the first number of active channels.

Example 14: the integrated circuit structure of Example 13, wherein the second stack comprises: a plurality of active channels; and a depopulated channel, wherein the depopulated channel comprises a concentration of dopants that inactivates the depopulated channel.

Example 15: the integrated circuit structure of Example 14, wherein a total number of channels in the second stack is equal to the first number of active channels in the first stack.

Example 16: the integrated circuit structure of Example 14, wherein the depopulated channel comprises a dopant concentration of approximately $1e19$ $cm^{-3}$ or greater of a dopant of a first conductivity type that is opposite of a second conductivity type of the second transistor.

Example 17: the integrated circuit structure of Examples 14-16, wherein the depopulated channel is above the plurality of active channels.

Example 18: the integrated circuit structure of Examples 13-17, wherein a topmost active channel of the second transistor is aligned with a topmost active channel of the first transistor, and wherein a depopulated region of the second transistor is adjacent to a bottommost active channel of the first transistor.

Example 19: the integrated circuit structure of Examples 13-18, wherein the first transistor and the second transistor are nanoribbon or nanowire transistors.

Example 20: a static random-access memory (SRAM) cell, comprising: a pair of pass-gate (PG) transistors, wherein individual ones of the PG transistors comprise a first stack of semiconductor channels; a pair of pull-up (PU) transistors, wherein individual ones of the PU transistors comprise a second stack of semiconductor channels; and a pair of pull-down (PD) transistors, wherein individual ones of the PD transistors comprise a third stack of semiconductor channels, and wherein a number of active channels in the second stack is smaller than a number of active channels in the first stack or the third stack.

Example 21: the SRAM cell of Example 20, wherein the second stack comprises a plurality of active channels and a depopulated channel, wherein the depopulated channel comprises a dopant concentration of approximately $1e19$ $cm^{-3}$ or greater of a dopant of a first conductivity type that is opposite of a second conductivity type of the PU transistors.

Example 22: the SRAM cell of Example 20 or Example 21, wherein a topmost active channel in the second stack is aligned with topmost active channels in the first stack and the third stack, and wherein bottommost active channels in the first stack and the third stack are aligned with a depopulated region in the second stack.

Example 23: an electronic device, comprising: a board; an electronic package coupled to the board; and a die electrically coupled to the electronic package, wherein the die comprises: a first transistor, wherein the first transistor comprises: a first stack of semiconductor channels, wherein a first number of active channels are in the first stack; and a second transistor, wherein the second transistor comprises: a second stack of semiconductor channels, wherein a second number of active channels in the second stack is smaller than the first number of active channels.

Example 24: the electronic device of Example 23, wherein the second stack comprises: a plurality of active channels; and a depopulated channel, wherein the depopulated channel comprises a concentration of dopants that inactivates the depopulated channel, and wherein a total number of channels in the second stack is equal to the first number of active channels in the first stack.

Example 25: the electronic device of Example 23 or Example 24, wherein a topmost active channel of the second transistor is aligned with a topmost active channel of the first transistor, and wherein a depopulated region of the second transistor is adjacent to a bottommost active channel of the first transistor.

What is claimed is:

1. An integrated circuit structure, comprising:
a first transistor, wherein the first transistor comprises:
a first stack of semiconductor channels, wherein a first number of active channels are in the first stack; and
a second transistor, wherein the second transistor comprises:
a second stack of semiconductor channels, wherein the second stack comprises a second number of active channels and a depopulated channel, and wherein the second number of active channels in the second stack is smaller than the first number of active channels.

2. The integrated circuit structure of claim 1, wherein the depopulated channel comprises a concentration of dopants that inactivates the depopulated channel.

3. The integrated circuit structure of claim 1, wherein a total number of channels in the second stack is equal to the first number of active channels in the first stack.

4. The integrated circuit structure of claim 1, wherein the depopulated channel comprises a dopant concentration of approximately 1e19 cm-3 or greater of a dopant of a first conductivity type that is opposite of a second conductivity type of the second transistor.

5. The integrated circuit structure of claim 1, wherein the depopulated channel is above the plurality of active channels.

6. The integrated circuit structure of claim 1, wherein a topmost active channel of the second transistor is aligned with a topmost active channel of the first transistor, and wherein the depopulated channel of the second transistor is adjacent to a bottommost active channel of the first transistor.

7. The integrated circuit structure of claim 1, wherein the first transistor and the second transistor are nanoribbon or nanowire transistors.

8. A computing device, comprising:
a board;
an electronic package coupled to the board; and
a die electrically coupled to the electronic package, wherein the die comprises:
a first transistor, wherein the first transistor comprises:
a first stack of semiconductor channels, wherein a first number of active channels are in the first stack; and
a second transistor, wherein the second transistor comprises:
a second stack of semiconductor channels, wherein the second stack comprises a second number of active channels and a depopulated channel, and wherein the second number of active channels in the second stack is smaller than the first number of active channels.

9. The computing device of claim 8, wherein the depopulated channel comprises a concentration of dopants that inactivates the depopulated channel, and wherein a total number of channels in the second stack is equal to the first number of active channels in the first stack.

10. The computing device of claim 8, wherein a topmost active channel of the second transistor is aligned with a topmost active channel of the first transistor, and wherein the depopulated channel of the second transistor is adjacent to a bottommost active channel of the first transistor.

11. The computing device of claim 8, further comprising:
a memory coupled to the board.

12. The computing device of claim 8, further comprising:
a communication chip coupled to the board.

13. An integrated circuit structure, comprising:
a first transistor, wherein the first transistor comprises:
a first stack of semiconductor channels, wherein a first number of active channels are in the first stack; and
a second transistor, wherein the second transistor comprises:
a second stack of semiconductor channels, wherein a second number of active channels in the second stack is smaller than the first number of active channels, wherein a topmost active channel of the second transistor is aligned with a topmost active channel of the first transistor, and wherein a depopulated region of the second transistor is adjacent to a bottommost active channel of the first transistor.

14. A computing device, comprising:
a board;
an electronic package coupled to the board; and
a die electrically coupled to the electronic package, wherein the die comprises:
a first transistor, wherein the first transistor comprises:
a first stack of semiconductor channels, wherein a first number of active channels are in the first stack; and
a second transistor, wherein the second transistor comprises:
a second stack of semiconductor channels, wherein a second number of active channels in the second stack is smaller than the first number of active channels, wherein a topmost active channel of the second transistor is aligned with a topmost active channel of the first transistor, and wherein a depopulated region of the second transistor is adjacent to a bottommost active channel of the first transistor.

* * * * *